(12) United States Patent
Socher et al.

(10) Patent No.: US 10,282,663 B2
(45) Date of Patent: May 7, 2019

(54) THREE-DIMENSIONAL (3D) CONVOLUTION WITH 3D BATCH NORMALIZATION

(71) Applicant: salesforce.com, inc., San Francisco, CA (US)

(72) Inventors: Richard Socher, Menlo Park, CA (US); Caiming Xiong, Palo Alto, CA (US); Kai Sheng Tai, Mountain View, CA (US)

(73) Assignee: salesforce.com, inc., San Francisco, CA (US)

( * ) Notice: Subject to any disclaimer, the term of this patent is extended or adjusted under 35 U.S.C. 154(b) by 374 days.

(21) Appl. No.: 15/237,575

(22) Filed: Aug. 15, 2016

(65) Prior Publication Data

US 2017/0046616 A1    Feb. 16, 2017

Related U.S. Application Data

(60) Provisional application No. 62/205,718, filed on Aug. 15, 2015.

(51) Int. Cl.
*G06N 3/08* (2006.01)
*G06N 3/04* (2006.01)
(Continued)

(52) U.S. Cl.
CPC ............. *G06N 3/088* (2013.01); *G06F 17/50* (2013.01); *G06K 9/00201* (2013.01);
(Continued)

(58) Field of Classification Search
None
See application file for complete search history.

(56) References Cited

U.S. PATENT DOCUMENTS

| 2010/0214936 A1* | 8/2010 | Ito ..................... G06K 9/00986 370/252 |
| 2016/0063359 A1 | 3/2016 | Szegedy et al. |
| 2018/0075599 A1* | 3/2018 | Tajbakhsh ............ A61B 5/0084 |

OTHER PUBLICATIONS

Maturana et al. ("3D Convolutional Neural Networks for Landing Zone Detection from LiDAR", IEEE ICRA, Jul. 2, 2015.*
(Continued)

*Primary Examiner* — Li Wu Chang
(74) *Attorney, Agent, or Firm* — Haynes and Boone, LLP

(57) ABSTRACT

The technology disclosed uses a 3D deep convolutional neural network architecture (DCNNA) equipped with so-called subnetwork modules which perform dimensionality reduction operations on 3D radiological volume before the 3D radiological volume is subjected to computationally expensive operations. Also, the subnetworks convolve 3D data at multiple scales by subjecting the 3D data to parallel processing by different 3D convolutional layer paths. Such multi-scale operations are computationally cheaper than the traditional CNNs that perform serial convolutions. In addition, performance of the subnetworks is further improved through 3D batch normalization (BN) that normalizes the 3D input fed to the subnetworks, which in turn increases learning rates of the 3D DCNNA. After several layers of 3D convolution and 3D sub-sampling with 3D across a series of subnetwork modules, a feature map with reduced vertical dimensionality is generated from the 3D radiological volume and fed into one or more fully connected layers.

27 Claims, 16 Drawing Sheets

(51) Int. Cl.
    G06F 17/50    (2006.01)
    G06K 9/46     (2006.01)
    G06T 7/00     (2017.01)
    G06K 9/00     (2006.01)
    G06K 9/62     (2006.01)

(52) U.S. Cl.
    CPC ....... *G06K 9/00993* (2013.01); *G06K 9/4628* (2013.01); *G06K 9/627* (2013.01); *G06N 3/04* (2013.01); *G06N 3/0454* (2013.01); *G06T 7/0012* (2013.01); *G06K 2209/05* (2013.01); *G06T 2207/10081* (2013.01); *G06T 2207/10116* (2013.01); *G06T 2207/20081* (2013.01); *G06T 2207/20084* (2013.01); *G06T 2207/30016* (2013.01); *G06T 2207/30041* (2013.01); *G06T 2207/30068* (2013.01)

(56) References Cited

OTHER PUBLICATIONS

Ji et al. "3D Convolutional Neural Networks for Human Action Recognition", IEEE PAMI, 2013, pp. 221-231.*
Loffe et al. "Batch Normalization: Accelerating Deep Network Training by Reducing Internal Covariate Shift", Mar. 2, 2015, https://arxiv.org/abs/1502.03167, pp. 11.*
Garcia-Pedraja, et. al., "Cooperative-Coevolution-of-Artificial-Neural-Networks", 2005, 32 pages.
Stanley, et al., "Evolving Neural Networks through Augmenting Topologies", 2002, 30 pages.
Snoek, et al., "Scalable Bayesian Optimization Using Deep Neural Networks", 2015, 13 pages.
PCT/US2016/047104—International Search Report & Written Opinion dated Nov. 30, 2016, 18 pages.
De Brebjsson et al, "Deep Neural Networks for Anatomical Brain Segmentation", 2015 IEEE Conference, Jun. 7, 2015, 9 pages.
Payan, et al., "Predicting Alzheimer's Disease: a Neuroimaging Study With 3D Convolutional Neural Networks", Feb. 10, 2015, 9 pages.
Kamnitsas, et al., "Multi-Scale 3D Convolutional Neural Networks for Lesion Segmentation in Brain MRI", Aug. 10, 2015, 4 pages, [Retreived on Jan. 13, 2016], Retrieved from the internet <URL:http://www.doc.ic.ac.uk/-bglocker/pdfs/kamnitsas2015isles.pdf>.
MICCAI, "BraTS Challenge Manuscripts", Sep. 14, 2014, 42 pages, [Retreived on Nov. 22, 2016], Retrieved from the Internet: <URL:http://people.csail.mit.edu/menze/papers/proceedings miccai brats> 2014. pdf>.
Szegedy, et al., "Going Deeper with Convolutions", 2015, 9 pages.
Ioffe, et al., "Batch Normalization: Accelerating Deep Network Training by Reducing Internal Covariate Shift", proceedings of the 32nd International Conference on Machine Learning, France, 2015, 9 pages.
Krizhevsky, et al.,"ImageNet Classification with Deep Convolutional Neural Networks", Advances in Neural Information Processing Systems 25, 2012, 9 pages.
Guobin Chen, et al., "Deep convolutional neural network based species recognition for wild animal monitoring," 2014 IEEE International Conference on Image Processing (ICIP), 2014, pp. 858-862 (5 pages).
Wang, et al., "Forest fire image classification based on deep neural network of sparse autoencoder," Computer Engineering and Applications, 2014, 50(24): 173-177 (5 pages).

* cited by examiner

THREE-DIMENSIONAL (3D) CONVOLUTION WITH 3D BATCH NORMALIZATION

PRIORITY APPLICATION

This application is related to and claims the benefit of U.S. Provisional Patent Application 62/205,718, "Medical Vision System", filed on Aug. 15, 2015. The priority provisional application is hereby incorporated by reference for all purposes.

FIELD OF THE TECHNOLOGY DISCLOSED

The technology disclosed generally relates to improving utilization of computing resources such as computational power and memory use during processing of three-dimensional (3D) data inside a 3D deep convolutional neural network architecture (DCNNA), and in particular relates to performing computationally efficient 3D image classification and object recognition in a convolutional neural network (CNN).

BACKGROUND

The subject matter discussed in this section should not be assumed to be prior art merely as a result of its mention in this section. Similarly, a problem mentioned in this section or associated with the subject matter provided as background should not be assumed to have been previously recognized in the prior art. The subject matter in this section merely represents different approaches, which in and of themselves can also correspond to implementations of the claimed technology.

The technology disclosed makes it feasible to utilize convolutional neural networks (CNNs) in big-data scenarios such as medical imaging, where huge amount of data is needed to be processed with limited memory and computational capacity. A major technical problem with existing deep convolution neural networks (CNNs) is the requirement of significant computational resources. The technology disclosed solves this technical problem by adding so-called subnetworks within a 3D deep convolutional neural network architecture (DCNNA), which perform dimensionality reduction operations on 3D data before the 3D data is subjected to computationally expensive operations. Also, the subnetworks convolve the 3D data at multiple scales by subjecting the 3D data to parallel processing by different 3D convolutional layer paths (e.g., 1×1×1 convolution, 3×3×3 convolution, 5×5×5 convolution, 7×7×7 convolution). Such multi-scale operations are computationally cheaper than the traditional CNNs that perform serial convolutions. In addition, performance of the subnetworks is further improved through 3D batch normalization (BN) that normalizes the 3D input fed to the subnetworks, which in turn increases learning rates of the 3D DCNNA.

Machine learning is a field of study within the area of Artificial Intelligence (AI) that gives computers the ability to learn without being explicitly programmed. As opposed to static programming, machine learning uses algorithms trained on some data to make predictions related to that or other data. Deep learning is a form of machine learning that models high level abstractions in data by layers of low level analytics of that data. Recently, CNNs have led to major improvements in image classification and object recognition. By training multiple layers of convolutional filters, The generalization capability of many machine learning tools like support vector machines (SVM), PCA, linear discriminant analysis (LDA), Bayesian interpersonal classifier tend to get saturated quickly as the volume of the training increases. But, CNNs have shown to perform better as compared to traditional machine learning algorithms when trained with large number of diverse images at different times. CNNs are capable of automatically learning complex features for object recognition and achieve superior performance compared to hand-crafted features.

However, CNNs require large amount of training data, without which the network fails to learn and deliver impressive recognition performance. Training such massive data requires huge computational resources, like thousands of CPU cores and/or GPUs, making the application of CNN rather limited and not extendable to mobile and embedded computing. Therefore, CNN architectures that improve the performance of computational resources analyzing big data are required.

BRIEF DESCRIPTION OF THE DRAWINGS

In the drawings, like reference characters generally refer to like parts throughout the different views. Also, the drawings are not necessarily to scale, with an emphasis instead generally being placed upon illustrating the principles of the technology disclosed. In the following description, various implementations of the technology disclosed are described with reference to the following drawings, in which.

DESCRIPTION

Introduction

Figure 1:
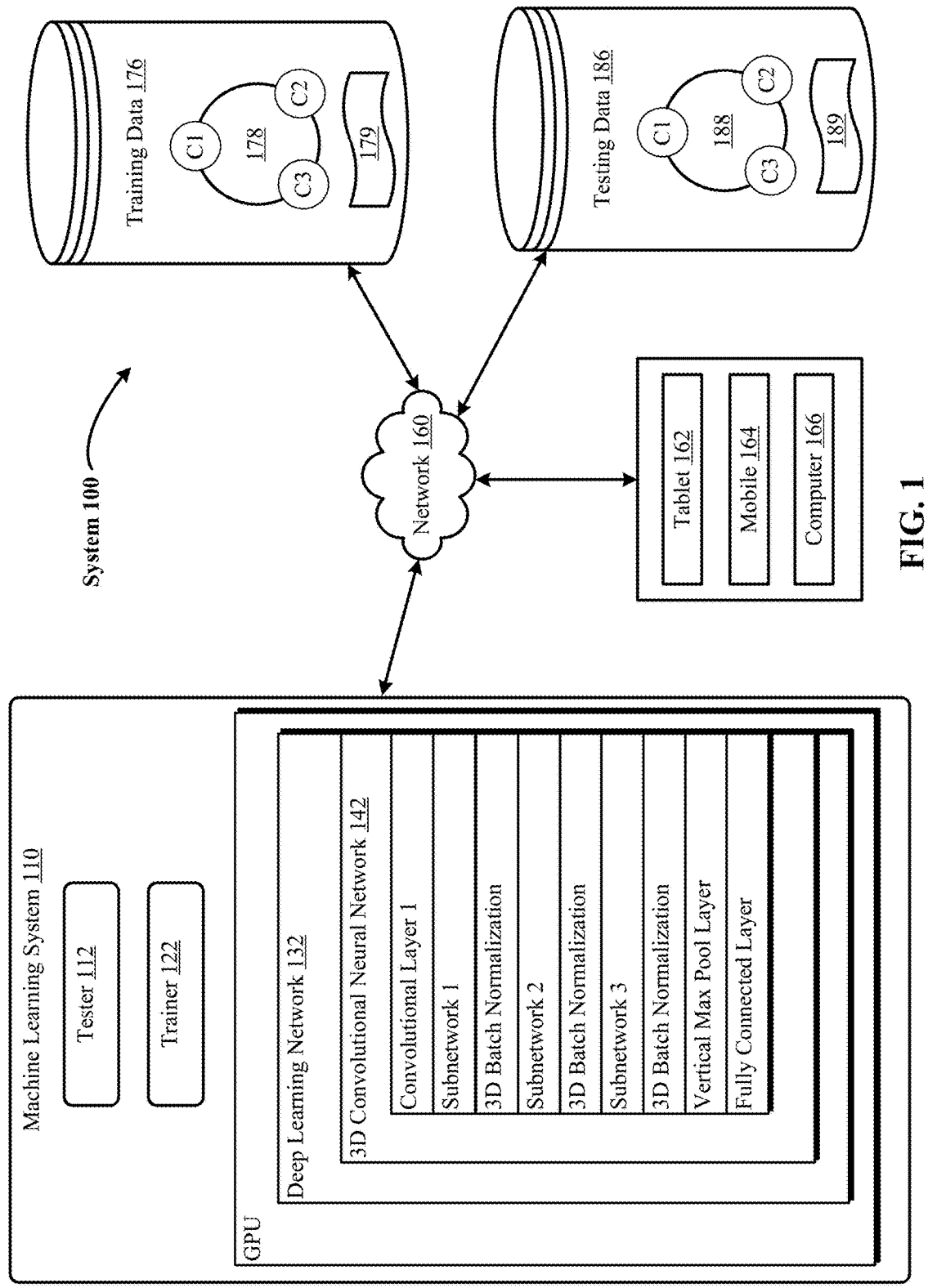
FIG. 1 illustrates an architectural level schematic of a system in accordance with an implementation.

The following detailed description is made with reference to the figures. Sample implementations are described to illustrate the technology disclosed, not to limit its scope, which is defined by the claims. Those of ordinary skill in the art will recognize a variety of equivalent variations on the description that follows.

The discussion is organized as follows. First, an introduction describing some of the problems addressed by various implementations will be presented. Then, a high-level description of one implementation will be discussed at an architectural level. Next, the algorithms used by some implementations to efficient process 3D data are discussed. Lastly, more detailed architectures for implementing the system, together with examples of 3D data, a sample use case that applies the disclosed 3D deep convolutional neural network architecture (DCNNA), some experimental results, processes and integration with a multi-tenant environment are discussed.

Processing 3D in CNNs comes with an increased number of parameters and significant memory and computational requirements. Conventional CNNs extract feature maps from a set of input 3D images with scalar or vectorial voxel-wise signals by combining data encoding and decoding. The input image is encoded by mapping each fixed voxel neighborhood to a vectorial feature space in the hidden layer and is reconstructed back in the output layer to the original image space. To extract features that capture characteristic patterns of input data variations, training of the autoencoder employs back-propagation and constraints on properties of the feature space to reduce the reconstruction error. However, extracting global features from 3D images with vectorial voxel-wise signals is computationally expensive and requires too large training data sets, due to growing fast numbers of parameters to be evaluated in the input (encoding) and output (decoding) layers.

To overcome the computational burden of processing 3D data, the technology disclosed uses a 3D deep convolutional neural network architecture (DCNNA) equipped with so-called subnetwork modules which perform dimensionality reduction operations on 3D radiological volume before the 3D radiological volume is subjected to computationally expensive operations. In addition, performance of the sub-networks is further improved through 3D batch normalization (BN) that normalizes the 3D input fed to the subnetworks, which in turn increases learning rates of the 3D DCNNA. After several layers of 3D convolution and 3D sub-sampling with 3D kernels (i.e., matrices of learned hidden weights) across a series of subnetwork modules, a feature map with reduced vertical dimensionality is generated from the 3D radiological volume and fed into one or more fully connected layers. After the fully connected layers' computation, a classified or regressed output is generated. In one exemplary implementation, the 3D DCNNA comprises of at least three subnetwork modules, each followed by a 3D BN layer, some convolutional layers, sub-sampling layers and fully connected layers and an output layer.

Since the weight updates to deeper layers of 3D DCNNA result in a continuously changing distribution of 3D input and corresponding alternative feature volume representations or feature maps, which hinders the convergence of their weights. In one implementation, at training iterations, the weight updates cause deviation to the variance of the weights, such the alternative feature volume representations to be amplified at the next iteration. Furthermore, the problem is worsened with 3D features because any deviation is amplified by an exponential based on the number of layers. The technology disclosed counters this by adopting a 3D batch normalization (BN) technique in the hidden layers of DCNNA, which allows for normalization of the nonlinearity activations of the DCNNA after every subnetwork-processing step in order to better preserve the resulting alternative feature volume representations. In one implementation, the geometric interpretation of this normalization is that if the 3D input data is a multivariable Gaussian, then the transformed data, in some implementations, is a Gaussian with zero mean and identity covariance. As a result, BN accelerates the learning of 3D DCNNA by increasing the learning rates and regularizing the learning.

Furthermore, medical professionals have various medical workflows in place to interpret 3D medical images and identify abnormalities in diagnostic tests. For example, for an annual mammogram a patient may be referred by their primary care physician to a radiology clinic. The patent has the mammogram resulting in a set of 3D medical images, for example x-rays, and possibly an on-site specialist may do a preliminary review of the x-rays to see if additional views or replacement images are needed. The X-rays are then queued in an electronic system for a specialist to examine and write a diagnosis for the primary care physician. The patient waits for a call from her primary care physician to obtain the results of the mammogram. This process can take several weeks from mammogram to results. What is needed is a new process for handling such 3D medical images to allow a shorter response time, a reduction in diagnostic errors, and enable less specialized or experienced medical professionals to perform at a higher level.

Examples of systems, apparatus, and methods according to the disclosed implementations are described in a medical vision context and 3D data. In other instances, the technology disclosed can be applied to information technology, fraud detection, telecommunications systems, financial systems, security trading, banking, business intelligence, marketing, mining, energy, etc. and 2D, 3D, 4D, or nD data. Other services are possible, such that the following examples should not be taken as definitive or limiting either in scope, context, or setting.

The technology disclosed relates to improving utilization of computing resources such as computational power and memory use during processing of three-dimensional (3D) data inside a deep convolutional neural network architecture. The technology disclosed can be implemented in the context of any computer-implemented system including an on-demand database system, a multi-tenant environment, or the like. Moreover, this technology can be implemented using two or more separate and distinct computer-implemented systems that cooperate and communicate with one another. This technology can be implemented in numerous ways, including as a process, a method, an apparatus, a system, a device, a computer readable medium such as a computer readable storage medium that stores computer readable instructions or computer program code, or as a computer program product comprising a computer usable medium having a computer readable program code embodied therein.

The technology disclosed can be implemented in the context of any computer-implemented system including a database system, a multi-tenant environment, or a relational database implementation like an Oracle™ compatible database implementation, an IBM DB2 Enterprise Server™ compatible relational database implementation, a MySQL™ or PostgreSQL™ compatible relational database implementation or a Microsoft SQL Server™ compatible relational database implementation or a NoSQL non-relational database implementation such as a Vampire™ compatible non-relational database implementation, an Apache Cassandra™ compatible non-relational database implementation, a BigTable™ compatible non-relational database implementation or an HBase™ or DynamoDB™ compatible non-relational database implementation.

In addition, the technology disclosed can be implemented using different programming models like MapReduce™, bulk synchronous programming, MPI primitives, etc. or different stream management systems like Apache Storm™, Apache Spark™, Apace Kafka™, Truviso™, IBM InfoSphere™, Borealis™ and Yahoo! S4™.

System Overview

We describe a system and various implementations for performing computationally efficient 3D image classification and object recognition in a convolutional neural network (CNN). The system and processes will be described with reference to FIG. 1 showing an architectural level schematic of a system in accordance with an implementation. Because FIG. 1 is an architectural diagram, certain details are intentionally omitted to improve the clarity of the description. The discussion of FIG. 1 will be organized as follows. First, the elements of the figure will be described, followed by their interconnections. Then, the use of the elements in the system will be described in greater detail.

FIG. 1 includes the system 100. The system 100 includes machine learning system 110, computational devices like tablet 162, mobile 164 and computer 166, training data store 176, testing data store 186 and network 160. The machine learning system 110 includes tester 112, trainer 122, deep learning network 132 and 3D convolutional neural network (CNN) 142.

The interconnection of the elements of system 100 will now be described. The network 160 couples the tablet 162, the mobile 164, the computer 166, the training data store 176, the testing data store 186 and the machine learning system 110 in communication (indicated by solid lines). The actual communication path can be point-to-point over public and/or private networks. Some items, such as testing data, might be delivered indirectly, e.g. via an application store (not shown). The communications can occur over a variety of networks, e.g. private networks, VPN, MPLS circuit, or Internet, and can use appropriate APIs and data interchange formats, e.g. REST, JSON, XML, SOAP and/or JMS. The communications can be encrypted. This communication is generally over a network such as the LAN (local area network), WAN (wide area network), telephone network (Public Switched Telephone Network (PSTN), Session Initiation Protocol (SIP), wireless network, point-to-point network, star network, token ring network, hub network, Internet, inclusive of the mobile Internet, via protocols such as EDGE, 3G, 4G LTE, Wi-Fi, and WiMAX. Additionally, a variety of authorization and authentication techniques, such as username/password, OAuth, Kerberos, SecureID, digital certificates, and more, can be used to secure the communications.

3D Convolutional Neural Network (CNN)

Having described the elements of FIG. 1 and their interconnections, elements of the figure will now be described in greater detail. The machine learning system 110 provides a variety of functionalities via a tester 112 and a trainer 122. Trainer 122 trains the 3D convolutional neural network (CNN) 142 by minimizing a cost function. In one implementation, the cost function is minimized using a stochastic gradient descent (SGD) that relies on a back propagation algorithm to estimate gradients. In some implementations, trainer 122 uses SGD to perform iterative updates based on gradients estimated from mini-batches with a given batch size, where an update occurs after each mini-batch. In one implementation, each gradient update is further augmented by a moment based learning rule that updates the various parameters of the 3D CNN 142 as a weighted combination of the current gradients and the gradients of the previous iteration update based on the error values of the 3D CNN 142 determined by the cost function during forward propagation.

For training the 3D CNN 142, 3D data is used from training data store 176. In one implementation, training data store 176 is maintained and used by a first business entity that offers the 3D CNN 142 as a service or product. In another implementation, training data store 176 is populated by the first business entity in collaboration with a second business entity (e.g., an intermediary vendor) that applies the 3D CNN 142 developed by the first business entity to solve a business or technical problem. In yet another implementation, training data store 176 is populated using data provided by or generated using end users (e.g., crowd sourcing). In one implementation, 3D CNN 142 serves as a learning system with a medical vision focus which performs computer vision tasks with state-of-the-art accuracy and reliability. This medical vision system is trained using examples labeled by medical professionals and then deployed to assist in the identification and diagnosis of certain medical issues based on imaging data. During training, 3D medical images and/or portions of images that have been characterized by appropriate medical professionals as containing healthy and/or abnormal elements are provided to the deep learning medical vision system.

Training data, in one implementation, consists of one or more images or sets of images. In one implementation, each of the images or set of images is associated with one or more additional pieces of information. In some implementations, the additional pieces of information comprise a label for an image or a set of images. In one implementation, training data is a set of labeled sets of computed tomography (CT) scans. Other implementations include other image types, including ultrasound, magnetic resonance imaging (MRI) images.

3D medical images may contain a variety of subjects, for example fundus photography exemplifying a variety of heathy and abnormal eyes. Fundus of the eye images may be in a variety of formats. Possible eye abnormalities include diabetic retinopathy, papilledema and ophthalmologic manifestations of arterial hypertension, amongst other eye abnormalities. Other 3D medical images may include other subjects. For example, possible CT scans include cranial CT scans containing a variety of heathy and abnormal subjects. For example, abnormal cranial CT scans may show one or more of intracranial hemorrhaging, epidural hematoma, subdural hematoma, intraparenchymal hemorrhage, intraventricular hemorrhage, subarachnoid hemorrhage, dilation/shift of ventricles, cistern abnormalities, mass lesions/mass effect, general evidence of edema, abscesses, clots indicating an ischemic infarction, skull fractures and hyperdense middle cerebral artery (MCA). Other 3D medical images of the same or other areas may show other abnormal subjects, such as lung or heart abnormalities, for example, pulmonary embolism.

In some implementations, training data may be processed by 3D CNN 142. Image processing includes one or more operations to manipulate the data within the training data images. Examples of image processing include normalizing training data to a particular size or number of pixels or voxels, level of granularity, image format, etc. In one implementation, image processing may include rescaling training data to a particular size to meet a threshold of size or number of pixels or number of voxels or intensity of the voxels or level of granularity and centering training data on a particular type of content or orienting training in a particular or consistent direction.

In some implementations, image processing includes creating a two dimensional (2D) collage of a three dimensional (3D) volume, allowing two dimensional (2D) processing of the training data images. In one implementation, image processing includes selecting a subset of a three dimensional (3D) volume. In some implementations, a 3D medical image may be stitched together from multiple related images. In some implementations, a collage may be created from more than one medical image.

Once all the parameters of the 3D CNN 142 are learned during training from training data store 176, 3D CNN 142 is ready for image classification and object recognition from test data. In one implementation, test data is 3D data stored in the testing data store 186. During testing, tester 112 executes the 3D CNN 142, which makes predictions on 3D input data without doing a full back propagation. In the case of image classification, at test time, 3D input data is passed through the various convolutional layers, subnetworks, batch normalization layers, and pooling layers of the 3D CNN 142 to generate a feature map, which estimates the posterior probabilities of the 3D input data belonging to one or more categories. In one implementation, testing data store 186 is maintained and used by a first business entity that offers the 3D CNN 142 as a service or product. In another implementation, testing data store 186 is populated by the first business entity in collaboration with a second business entity (e.g., an intermediary vendor) that applies the 3D CNN 142 developed by the first business entity to solve a business or technical problem. In yet another implementation, testing data store 186 is populated using data provided by or generated using end users (e.g., crowd sourcing).

In one implementation shown in system 100, 3D training and testing data are stored in a NoSQL key-value column store distributed storage systems 178 and 188 such as Cassandra™. 3D data in Cassandra™ is spread out across many nodes or commodity servers C1-C3, connections to which can be made using a Java, Scala, Ruby, Clojure or Python based APIs (e.g., Hector, Pelops, CQL, Thrift, Phpcassa, PyCassa, etc.). In other implementations, 3D training and testing data are stored in a Hadoop distributed file system (HDFS) like Hadoop clusters 179 and 189.

3D Data/3D Radiology Volume

Figure 7:
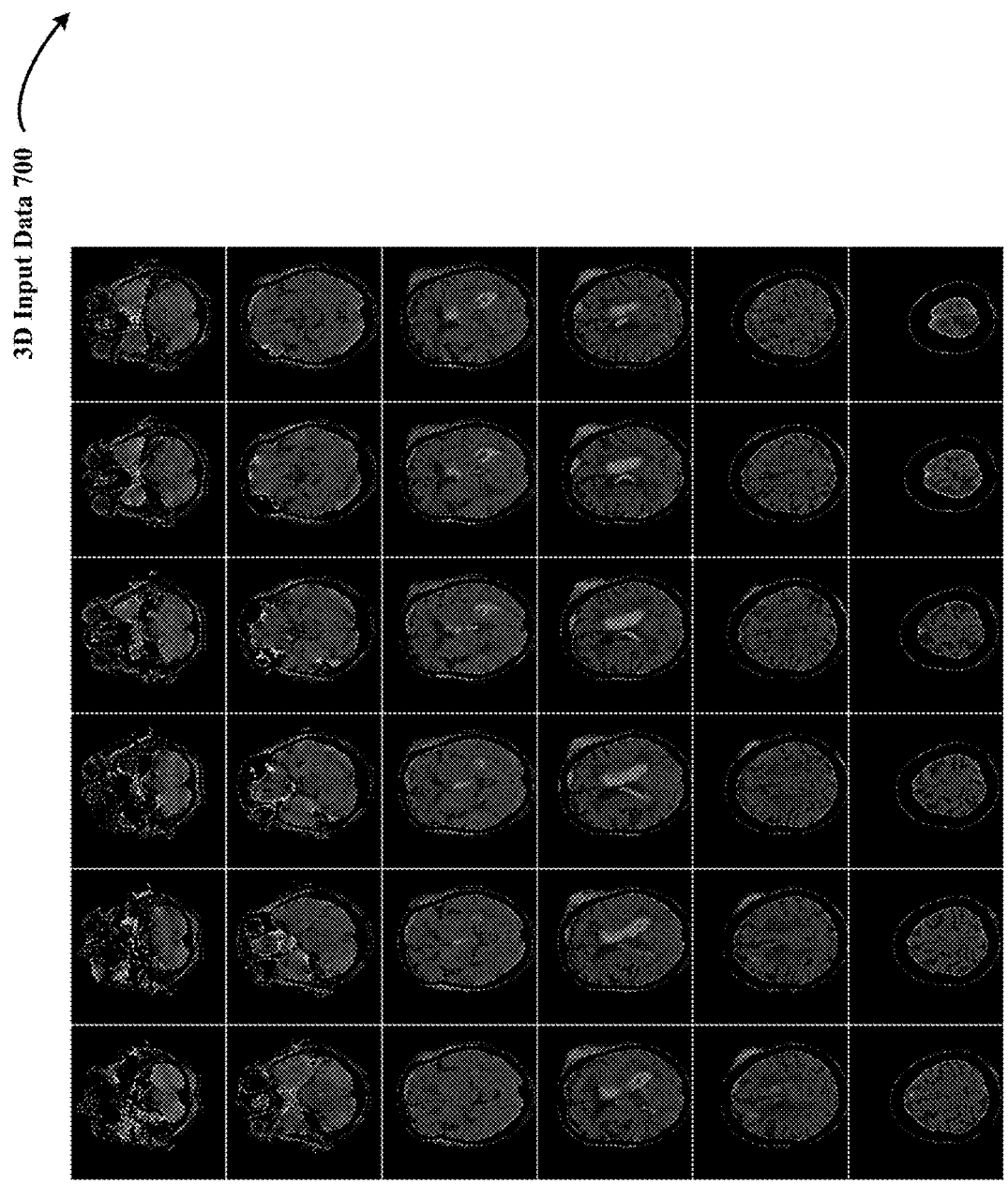
FIG. 7 shows an example of grey-scaled 3D input data used by the 3D DCNNA in the form of 3D radiological volume of medical scans of a human brain.
Figure 8:
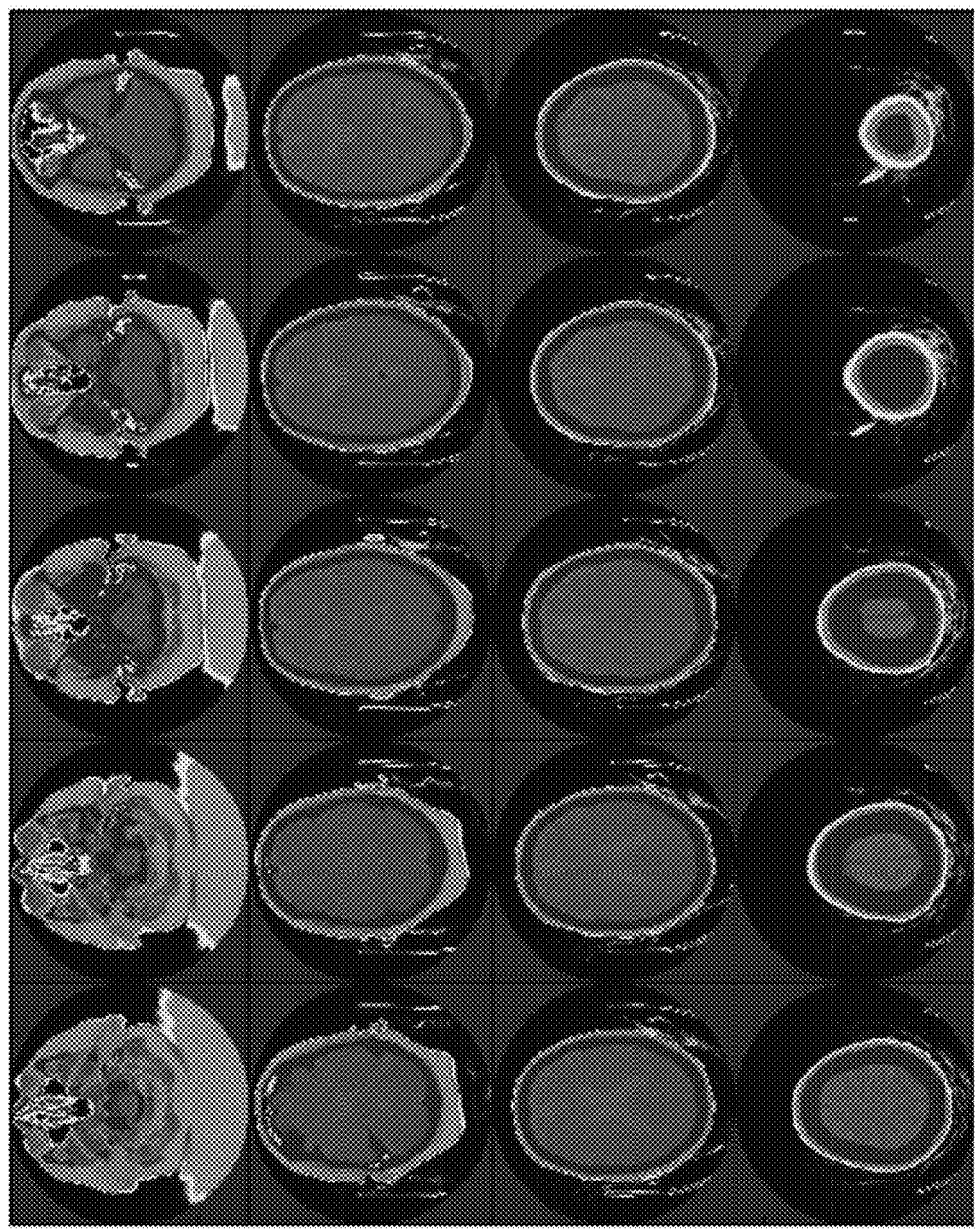
FIG. 8 illustrates an example of colored 3D input data used by the 3D DCNNA in the form of 3D radiological volume of medical scans of a human brain.

In some implementations, 3D training and testing data are volumetric representations with each point (x, y, z) mapped to discrete voxel coordinates (i, j, k). In one implementation, the 3D input data has a volume of D×D×D voxels set to a fixed occupancy or surface curvature grid (e.g., 24×24×24, 32×32×32, 256×256×256, 200×150×150, 317×215×254, 36×224×224). In one implementation in the medical vision context, the 3D training and testing data is 3D radiological volume representing 3D anatomical shape variations of a human organ structure generated from medical scans. FIG. 7 shows an example of grey-scaled 3D input data 700 used by the 3D DCNNA in the form of 3D radiological volume of medical scans (e.g., MRIs, CTs) of a human brain. FIG. 8 illustrates an example of colored 3D input data 800 used by the 3D DCNNA in the form of 3D radiological volume of medical scans of a human brain. In one implementation, 3D radiological volume 700 and 800 represent 3D model of a human brain. In yet other implementations, 3D radiological volume 700 and 800 represent 3D point clouds. In other implementations, other examples of 3D training and testing data include CAD (computer-aided drafting) models.

Deep learning network 132 operates on or more GPUs. Deep learning network 132 is a feed-forward network formed by stacking multiple layers of artificial neurons. Each layer models a new representation of data, in which neurons act as feature detectors. Recursively, deeper neurons learn to detect new features formed by those detected by the previous layer. The result is a hierarchy of higher and higher level feature detectors. Deep learning network 132 further comprises of 3D CNN 142, which also operates on at least one GPU. In one implementation, 3D CNN 142 operates on the processors of one or more client devices such as the tablet 162, the mobile 164 and the computer 166.

In one implementation, 3D CNN 142 includes convolutional layers, subnetworks, 3D batch normalization layers, pooling layers and fully connected layers. 3D CNN 142 uses so-called 3D receptive fields, which are fixed-size 3D patches or 3D kernels to compute convolution with the same size patch over the 3D input data/radiological volume. In one implementation, a stride is set to ensure every voxel in the 3D radiological volume and intermediate feature maps is covered to generate output feature maps. In some implementations, after a convolution operation, a sub-sampling is done with intermediate feature maps to reduce the dimension and prevent repetitive computation. In some implementations, fully connected layers are used to concatenate the multi-dimension feature maps and to make the feature map into fixed-size category as a classifier. The layers of the 3D CNN 142 have trainable parameters whose weights are adjusted during training using backpropagation, as discussed supra. The units in 3D CNN 142 use some form of nonlinearity activation, such as Sigmoid, rectified linear activation (ReLU) or leaky ReLU. In some implementations, the top layer of 3D CNN 142 uses a softmax activation function, which maps the 3D inputs into [0, 1]. This allows for interpreting the outputs as probabilities and selection of voxels with highest probability.

While system 100 is described herein with reference to particular blocks, it is to be understood that the blocks are defined for convenience of description and are not intended to require a particular physical arrangement of component parts. Further, the blocks need not correspond to physically distinct components. To the extent that physically distinct components are used, connections between components (e.g., for data communication) can be wired and/or wireless as desired. The different elements or components can be combined into single software modules and multiple software modules can run on the same hardware.

Subnetwork Modules

Figure 2:
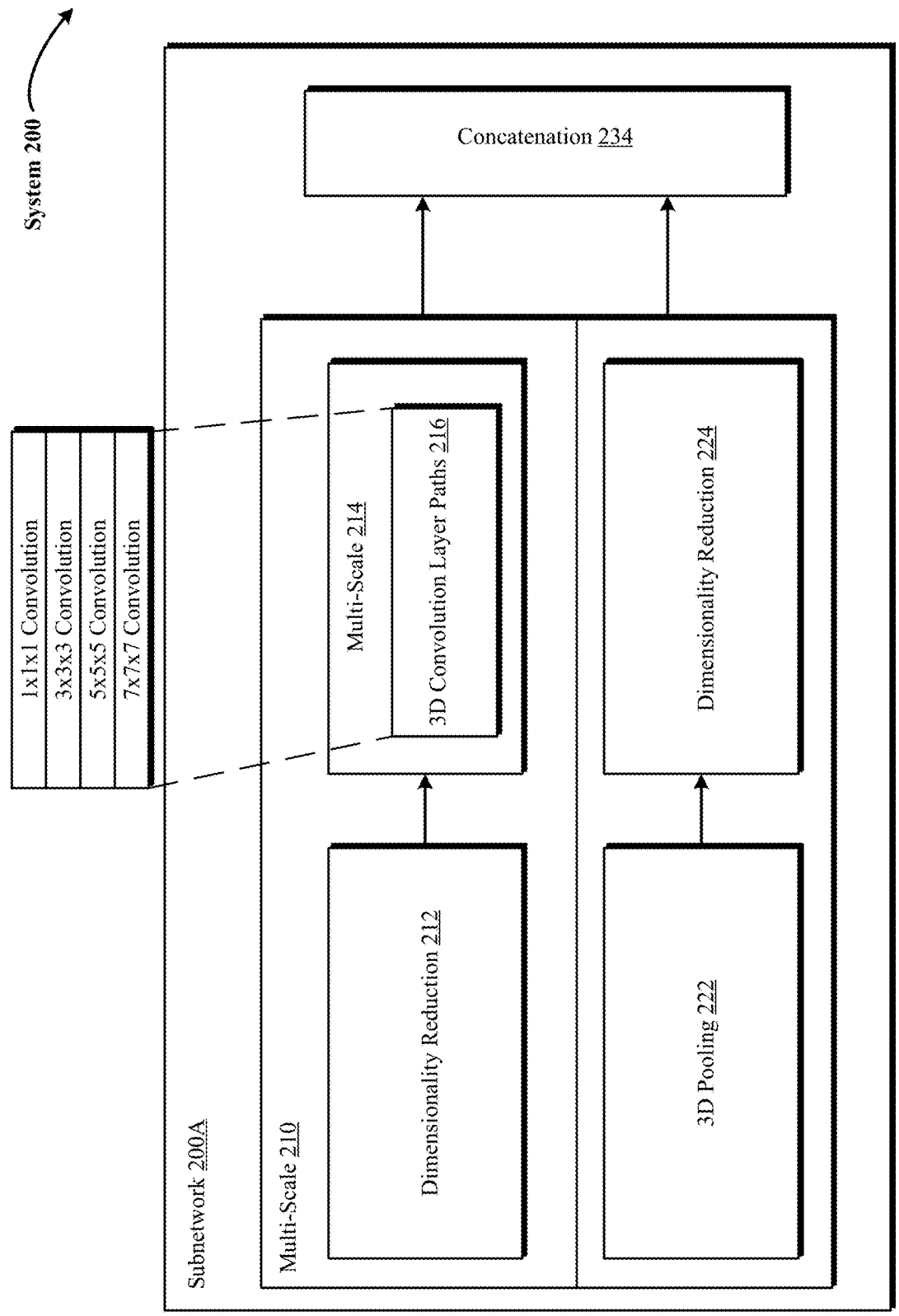
FIG. 2 illustrates a block diagram of a subnetwork within a 3D DCNNA in one implementation of the technology disclosed, showing in detail multi-scaled 3D convolution layer paths and 3D pooling operations.

FIG. 2 illustrates a block diagram 200 of a subnetwork 200A within a 3D DCNNA (such as 3D CNN 142) in one implementation of the technology disclosed, showing in detail multi-scaled 3D convolution layer paths and 3D pooling operations. In one implementation, subnetwork 200A takes a feature map as the input and applies in parallel several 3D convolutional layer paths varying from 1×1×1 convolutions to 3×3×3, 5×5×5 and 7×7×7 convolutions and 3D max pooling layers like 3×3×3 pooling. Furthermore, the 3D input data is processed by the subnetwork 200A at multiple scales 210 and 214. This means that the feature map fed to the subnetwork 200A as input is first processed in parallel at multi-scale 210 by the dimensionality reduction layer 212 and the 3D max pooling layer 222. Advancing further, the optimized feature map resulting from the 1×1×1 convolution of the dimensionality layer 212 is then processed in parallel at multi-scale 214 by the different 3D convolution layer paths 216 (e.g., 1×1×1, 3×3×3, 5×5×5, 7×7×7 convolutions). Each layer or layer path with subnetwork 200A generates different outputs or feature maps, which are concatenated into one feature map as the final output at the concatenation layer 234.

Dimensionality reduction layers 212 and 224 are used to conduct dimension reduction. For example, a 3D input of 36×224×224 voxels with 90 features on convolution with 40 filters of 1×1×1 would result in size of 40×36×224×224. In one implementation, the dimensionality reduction layers are also equipped with nonlinearity activation such as Sigmoid, ReLU or leaky ReLU. As depicted in FIG. 2, within subnetwork 200A, the 3D input is not fed directly into the 3D convolutional layer paths like 1×1×1, 3×3×3, 5×5×5 and 7×7×7 convolutions. Instead, an additional 1×1×1 convolution is used as dimensionality reduction layer 212 to reduce the input dimension. Furthermore, the output of a 3D max-pooling layer 222 is fed into an additional 1×1×1 convolution that serves as dimensionality reduction layer 224.

Figure 3:
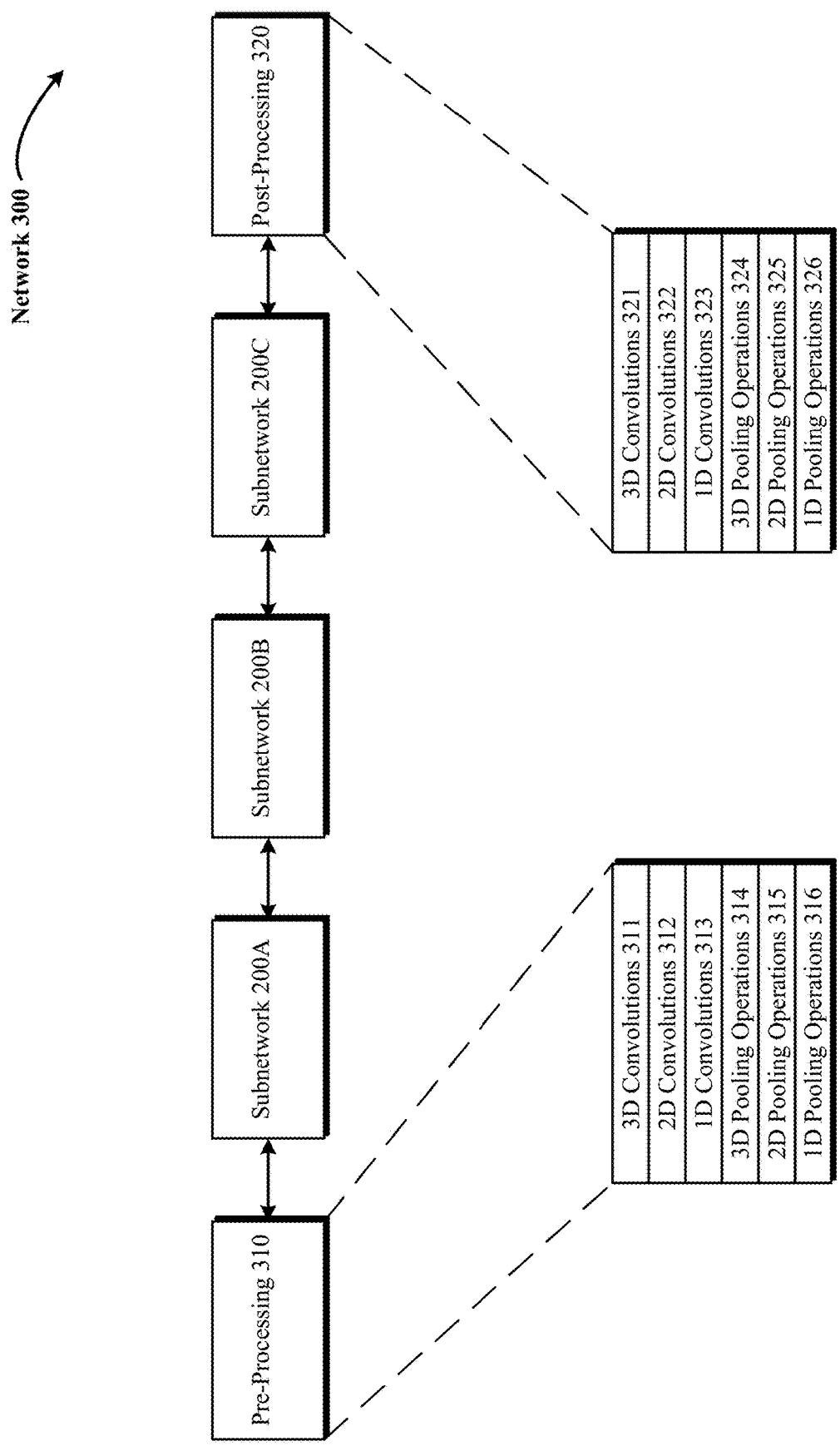
FIG. 3 is an exemplary 3D DCNNA with a plurality of subnetworks and pre- and post-processing layers.

FIG. 3 is an exemplary 3D DCNNA 300 (such as 3D CNN 142) with a plurality of subnetworks 200A, 200B and 200C arranged in a sequence from lowest to highest and pre-processing layer 310 and post-processing layer 320. In some implementations, the output of a preceding subnetwork (e.g., subnetwork 200A) is used as input for the next subnetwork's convolution and pooling (e.g., subnetwork 200B). Each of the subnetworks 200A, 200B and 200C generates an alternative feature volume representation or feature map of the input 3D radiological volume. In some implementations, the 3D input data/radiological volume are subjected to one or more pre-processing layers 310 such as 3D convolutions 311, 2D convolutions 312, 113 convolutions 313, 3D pooling operations 314, 2D pooling operations 315 and 1D pooling operations 316. In some implementations, the 3D input data/radiological volume are subjected to one or more post-processing layers 320 such as 3D convolutions 321, 2D convolutions 322, 113 convolutions 323, 3D pooling operations 324, 2D pooling operations 325 and 1D pooling operations 326. In one implementation, following processing the 3D input data and intermediate alternative feature volume representations or feature maps through three or more module subnetworks 200A, 200B and 200C, the output of the highest of the module subnetworks (such as subnetwork 200C) is processed through a vertical pooling layer to generate an output of reduced vertical dimensionality from the 3D input radiological volume.

Batch Normalization

Since the weight updates to deeper layers of 3D CNN 142 result in a continuously changing distribution of 3D input and corresponding alternative feature volume representations or feature maps, which hinders the convergence of their weights. In one implementation, at training iterations, the weight updates cause deviation to the variance of the weights, such the alternative feature volume representations to be amplified at the next iteration. Furthermore, the problem is worsened with 3D features F1 to Fn because any deviation is amplified by an exponential based on the number of layers. The technology disclosed counters this by adopting a 3D batch normalization (BN) technique in the hidden layers, which allows for normalization of the non-linearity activations of the 3D CNN 142 after every subnetwork-processing step in order to better preserve the resulting alternative feature volume representations. In one implementation, the geometric interpretation of this normalization is that if the 3D input data is a multivariable Gaussian, then the transformed data, in some implementations, is a Gaussian with zero mean and identity covariance. As a result, BN accelerates the learning of 3D CNN 142 by increasing the learning rates and regularizing the learning.

Figure 4A:
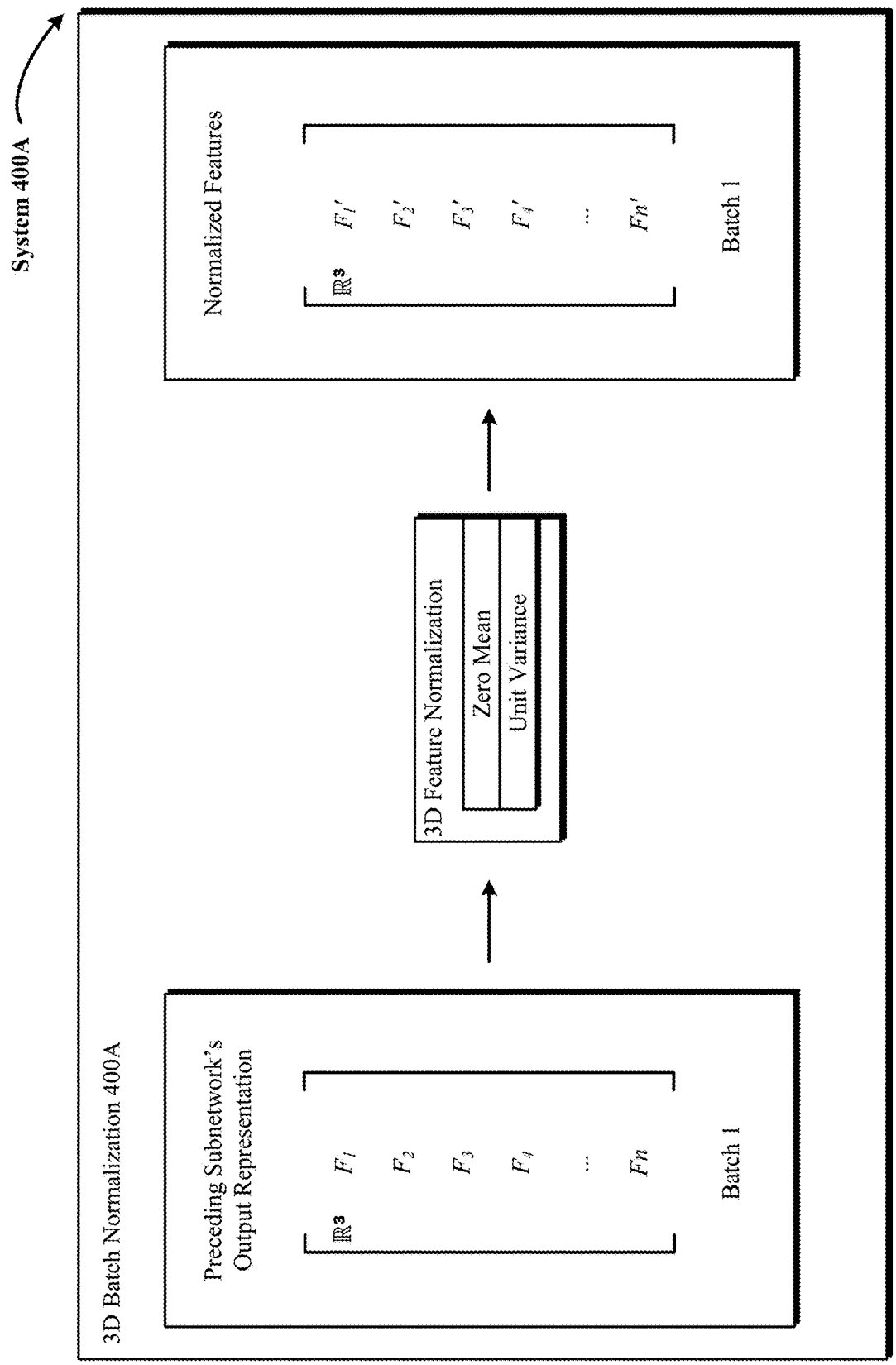
FIG. 4A illustrates one implementation of a 3D batch normalization (BN) operation applied to 3D input from a preceding subnetwork to generate normalized 3D input.

FIG. 4A illustrates one implementation of a 3D batch normalization (BN) operation 400A applied to 3D input from a preceding subnetwork to generate normalized 3D input. In FIG. 4A, 3D input from a preceding module subnetwork includes multiple 3D features F1 to Fn. In FIG. 4A, the three dimensionality of the features F1 to Fn is represented by the symbol $R^3$. At this step, the 3D features F1 to Fn are normalized to zero mean and unit variance, and then linearly transformed in FIG. 4B. The mean and variance are computed across each dimension of the 3D features F1 to Fn, i.e., over examples, and not per example from a mini-batch (e.g., batch 1) of the training dataset. In some implementations, a running average of the mean and variance is maintained to use for normalization during testing. The resulting normalized features F1' to Fn' are shown on the right in FIG. 4A.

Figure 4B:
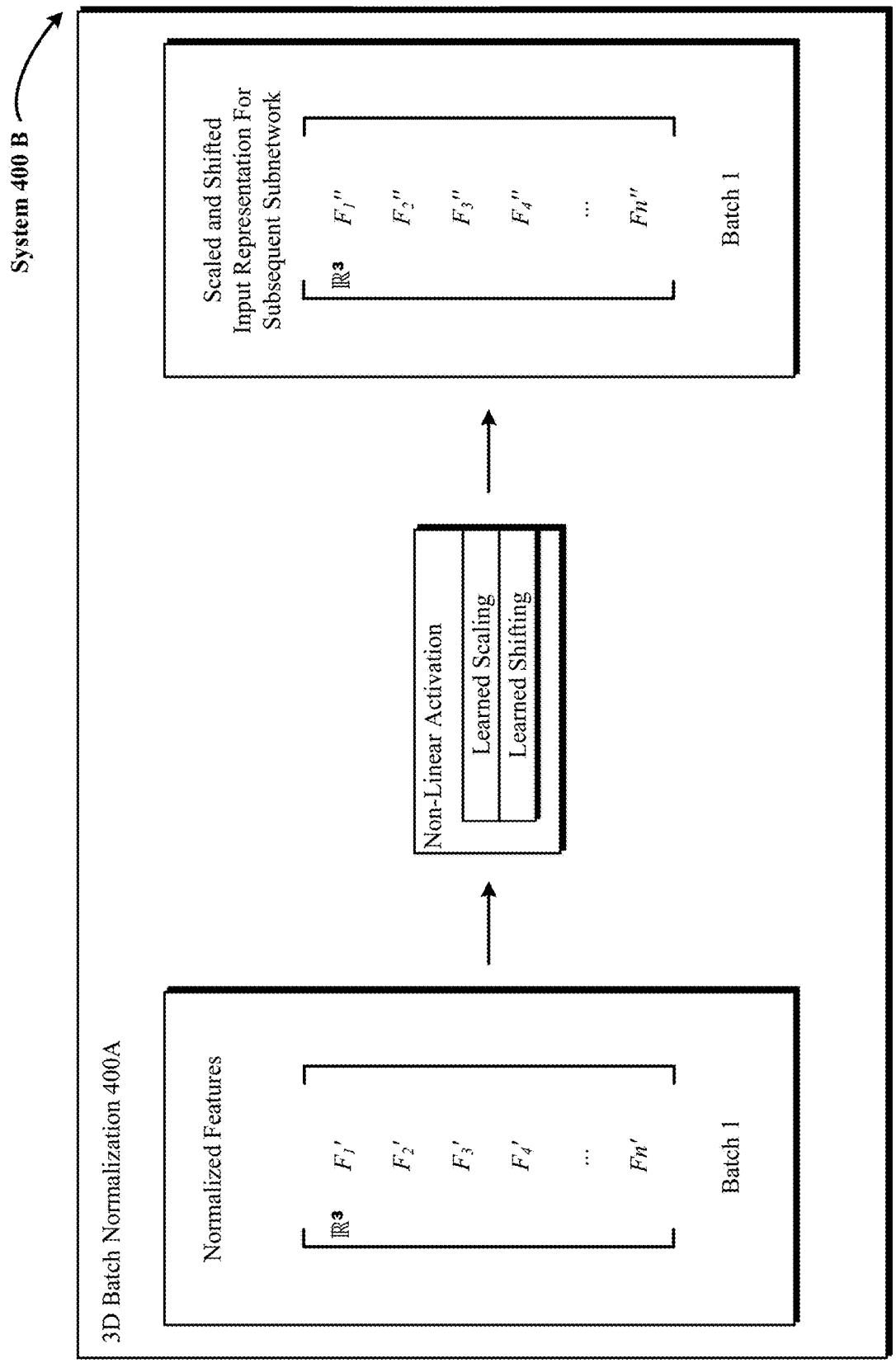
FIG. 4B shows one implementation of a 3D batch normalization (BN) operation that applies a separate learned nonlinearity activation to the normalized 3D input to scaled and shifted 3D output for processing by a subsequent subnetwork.

FIG. 4B shows one implementation of a 3D batch normalization (BN) operation 400B that applies a separate learned nonlinearity activation to the normalized 3D input to generate scaled and shifted 3D output for processing by a subsequent subnetwork. In one implementation, a 3D BN layer is introduced after a preceding subnetwork and immediately before a subsequent nonlinearity activation. In FIG. 4B, the three dimensionality of the normalized features F1' to Fn' is represented by the symbol $R^3$. At this step, a learned nonlinearity activation (e.g., ReLU nonlinearity ($y=\max(0, x)$) is applied to the normalized 3D features F1' to Fn' to generate scaled and shifted 3D features F1" to Fn" that can be used as input representations for the subsequent subnetwork. The nonlinearity activation is trained during back propagation using two parameters: a scale parameter and a shift parameter. During this step of the 3D BN, the scaled and shift parameters of the nonlinearity activation updated in the last backward pass are applied to the normalized 3D input of FIG. 4A. The resulting scaled and shifted features F1" to Fn" are shown on the right in FIG. 4B.

Figure 5:
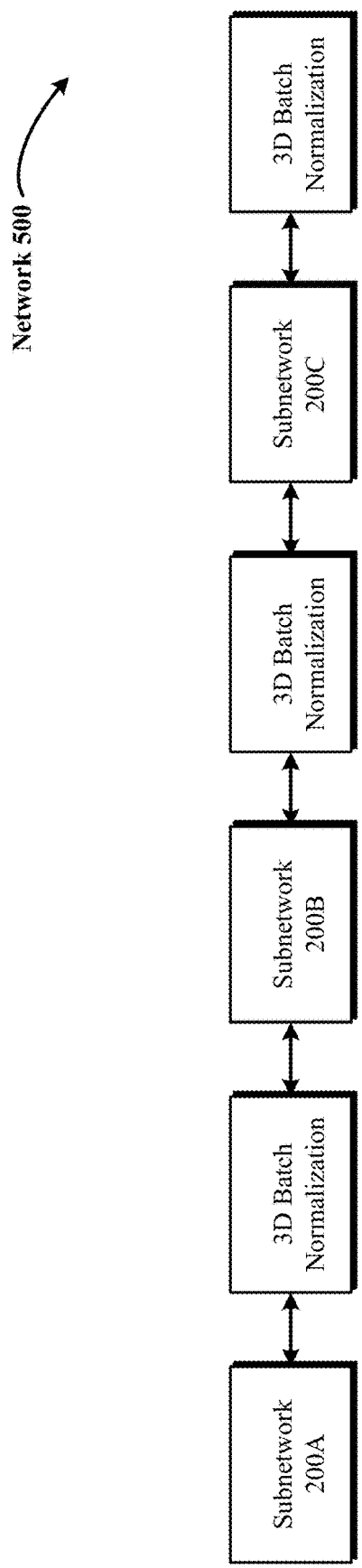
FIG. 5 illustrates a block diagram of a 3D DCNNA that uses a combination of a plurality of subnetworks and 3D batch normalization layers.

FIG. 5 illustrates a block diagram 500 of a 3D DCNNA (such as 3D CNN 142) that uses a combination of a plurality of subnetworks and 3D batch normalization layers. In FIG. 5, each of the subnetworks 200A, 200B and 200C are immediately followed by a 3D batch normalization layer that normalizes the output coming from a preceding subnetwork (e.g., subnetwork 200A) and applies a learned nonlinearity activation to the normalized output to generate a squashed input for the subsequent subnetwork (e.g., subnetwork 200B).

Exemplary Deep CNN Architecture (DCNNA)

Figure 6:
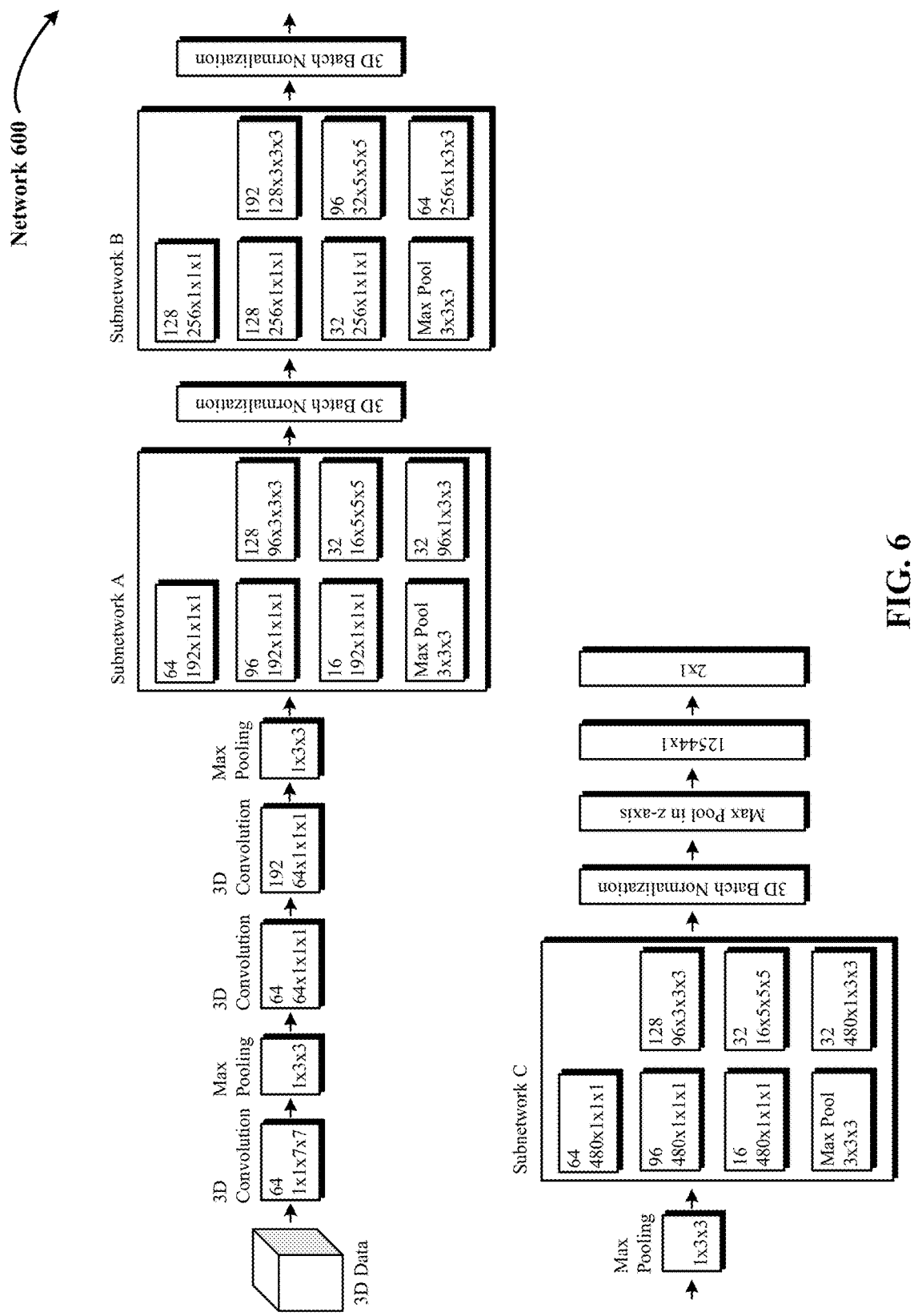
FIG. 6 depicts one implementation of an exemplary 3D DCNNA.

FIG. 6 depicts one implementation of an exemplary 3D DCNNA 600. At a high level, 3D DCNNA 600 comprises of three major parts: pre-processing layers, module subnetworks, 3D batch normalization (BN) layers and post-processing layers. Other implementations may perform the convolution operations in different orders and/or with different, fewer or additional actions than those illustrated in FIG. 6. Multiple convolution operations can be combined in some implementations.

In FIG. 6, 3D input data is first processed by pre-processing layers that comprise of a 3D convolution layer, followed by a 1D max pooling layer, which is followed by two more 3D convolution layers and a final 1D max pooling layer. The first 3D convolution layer includes 64 3D convolution kernels or filters of size 1×1×7×7, which means one feature convolved over 1×7×7 voxels. The following 1D max pooling layer is of size 1×3×3. Like the first 3D convolution layer, the second 3D convolution layer includes 64 3D convolution kernels or filters, but there is 64×1×7×7. The third 3D convolution layer comprises of 192 3D convolution kernels or filters of size 64×1×1×1. The final layer in the pre-processing layers is a 1D max pooling layer of size 1×3×3.

3D DCNNA 600 follows the process layout and pipeline described supra with respect to subnetwork 200A in FIG. 2. The next components of the 3D DCNNA 600 are module subnetworks A, B and C. All of the subnetworks A, B and C are 3D modules use 3D convolution layer paths with 3D convolution kernels or filters because the data being processing is 3D radiological volume. Further, each of the subnetworks A, B and C include at least one dimensionality reduction layer that uses 1×1×1 convolution to reduce the dimensionality of incoming alternative feature representations or feature maps before they are processed by 3D convolution layer paths of 1×1×1, 3×3×3, 5×5×5 convolution. Furthermore, each of the subnetworks A, B and C also employ a 3D max pooling layer, the output of which is further reduced in dimensionality by an additional dimensionality reduction of 1×1×1 convolution. Finally, the incoming alternative feature representations are processed in each of the subnetworks A, B and C at multiple scales such that the dimensionality reduction layer and the max pooling layer operate on the alternative feature representations in parallel and the outputs of the dimensionality reduction layer and the max pooling are also processed in parallel by the different 3D convolution layer paths.

Specifically, subnetwork A includes 64 3D convolution kernels or filters of size 192×1×1×1 (1×1×1 convolution), which serve as a dimensionality reduction layer. Subnetwork A also includes two 3D convolution layer paths of 128 3D convolution kernels or filters of size 96×3×3×3 (3×3×3 convolution) and 32 3D convolution kernels or filters of size 16×5×5×5 (5×5×5 convolution) that process the incoming feature maps in parallel at multi-scale. The inputs to these two layer paths are reduced by two corresponding dimensionality reduction layers of 98 3D convolution kernels or filters of size 192×1×1×1 (1×1×1 convolution) and 16 3D convolution kernels or filters of size 192×1×1×1 (1×1×1 convolution). The 3D max pooling layer is of size 3×3×3 and forwards its output to another 3D convolution layer path of size with 32 3D convolution kernels or filters of size 96×1×3×3. The outputs of the 64 3D convolution kernels or filters of size 192×1×1×1 (1×1×1 convolution), two 3D convolution layer paths of 128 3D convolution kernels or filters of size 96×3×3×3 (3×3×3 convolution) and 32 3D convolution kernels or filters of size 16×5×5×5 (5×5×5 convolution) and 3D convolution layer path of size with 32 3D convolution kernels or filters of size 96×1×3×3 are concatenated to produce 256 features.

Specifically, subnetwork B includes 128 3D convolution kernels or filters of size 256×1×1×1 (1×1×1 convolution), which serve as a dimensionality reduction layer. Subnetwork B also includes two 3D convolution layer paths of 192 3D convolution kernels or filters of size 128×3×3×3 (3×3×3 convolution) and 96 3D convolution kernels or filters of size 32×5×5×5 (5×5×5 convolution) that process the incoming feature maps in parallel at multi-scale. The inputs to these two layer paths are reduced by two corresponding dimensionality reduction layers of 128 3D convolution kernels or filters of size 256×1×1×1 (1×1×1 convolution) and 32 3D convolution kernels or filters of size 256×1×1×1 (1×1×1 convolution). The 3D max pooling layer is of size 3×3×3 and forwards its output to another 3D convolution layer path of size with 64 3D convolution kernels or filters of size 256×1×3×3. The outputs of the 128 3D convolution kernels or filters of size 256×1×1×1 (1×1×1 convolution), two 3D convolution layer paths of 192 3D convolution kernels or filters of size 128×3×3×3 (3×3×3 convolution) and 96 3D convolution kernels or filters of size 32×5×5×5 (5×5×5 convolution) and 3D convolution layer path of size with 64 3D convolution kernels or filters of size 256×1×3×3 are concatenated to produce 480 features.

Specifically, subnetwork C includes 64 3D convolution kernels or filters of size 480×1×1×1 (1×1×1 convolution), which serve as a dimensionality reduction layer. Subnetwork B also includes two 3D convolution layer paths of 128 3D convolution kernels or filters of size 96×3×3×3 (3×3×3 convolution) and 32 3D convolution kernels or filters of size 16×5×5×5 (5×5×5 convolution) that process the incoming feature maps in parallel at multi-scale. The inputs to these two layer paths are reduced by two corresponding dimensionality reduction layers of 96 3D convolution kernels or filters of size 480×1×1×1 (1×1×1 convolution) and 16 3D convolution kernels or filters of size 480×1×1×1 (1×1×1 convolution). The 3D max pooling layer is of size 3×3×3 and forwards its output to another 3D convolution layer path of size with 32 3D convolution kernels or filters of size 480×1×3×3. The outputs of the 64 3D convolution kernels or filters of size 480×1×1×1 (1×1×1 convolution), two 3D convolution layer paths of 128 3D convolution kernels or filters of size 96×3×3×3 (3×3×3 convolution) and 32 3D convolution kernels or filters of size 16×5×5×5 (5×5×5 convolution) and 3D convolution layer path of size with 32 3D convolution kernels or filters of size 480×1×3×3 are concatenated.

3D DCNNA 600 also immediately follows each of the subnetworks A, B and C with a 3D batch normalization layer, which subjects the respective concatenated outputs of subnetworks A, B and C to normalization and nonlinearity squashing across each of the dimensions. The post-processing layer includes a 1D max pooling layer of size 1×3×3 and a max pool convolution along the z-axis. The final alternative feature representation is of size 12544×1, which is further reduced to be of size 2×1.

Intracranial Hemorrhaging (IH) Use Case

Figure 9:
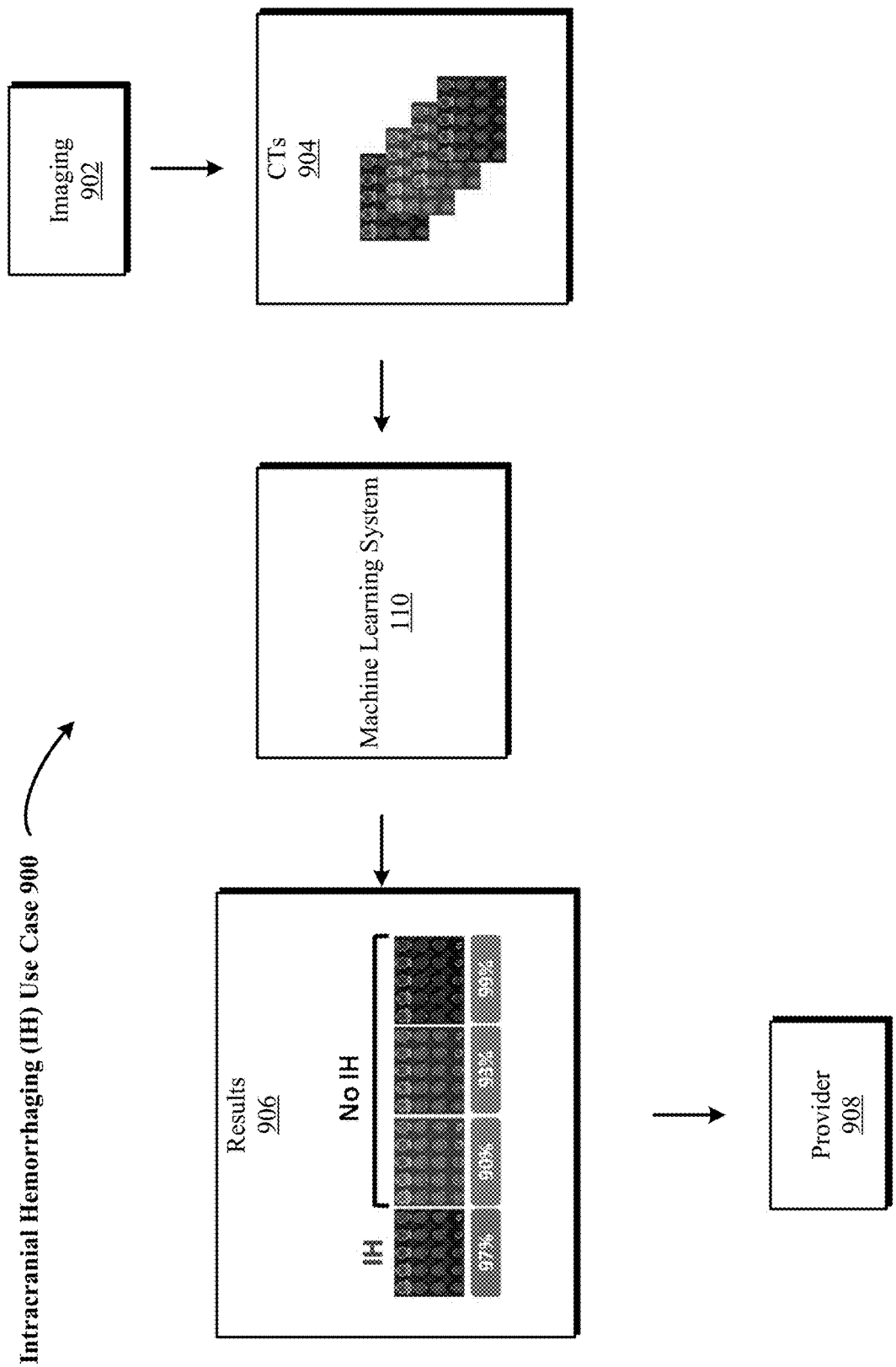
FIG. 9 is one implementation of a use case in which the 3D DCNNA is used to detect intracranial hemorrhaging (IH) structures in a human brain based on 3D radiological volumes generated from medical scans of the human brain.

FIG. 9 is one implementation of a use case 900 in which the 3D DCNNA is used to detect intracranial hemorrhaging (IH) structures in a human brain based on 3D radiological volumes generated from medical scans or imaging 902 of the human brain. 3D radiological volumes such as CT scans 904 are scans of a human brain. Machine learning system 110 is trained to identify the presence or absence of one or more types of abnormalities associated with the human brain. In some implementations, machine learning system 110 is trained to identify a single abnormality. In some implementations, machine learning system 110 is trained to identify more than one abnormality, called multi-class labeling. In some implementations, the identification of more than one abnormality is from a machine learning system 110 co-trained on more than one abnormality. For example, abnormalities of a human brain can include identification of hemorrhage, Alzheimer plaques and tangles and evidence of stroke. In this example, one implementation of the machine learning system 110 classifies the image of the human brain as healthy or abnormal, and then identifies what type of abnormality is present: intracranial hemorrhaging (IH), Alzheimer's and/or stroke and forwards the results 906 to a health service provider 908.

In another implementation for this example, machine learning system 110 classifies the input 3D radiological volume of a human brain as abnormal, including an indication of hemorrhage, evidence of possible Alzheimer's, or indications of a stroke. In some implementations, the confidence in the classification is also provided. In some implementations, more than one classification is provided with an associated confidence for each classification. In another implementation, the machine learning system 110 classifies the image as hemorrhage, Alzheimer's, stroke, or "normal", such that "normal" as a diagnosis is applied after looking at each possible abnormality and the associated confidence in each abnormality. In some implementations, the 3D radiological volume is of a human eye and machine learning system 110 is trained to identify one or more types of abnormalities associated with the human eye.

Accordingly, machine learning system 110 decreases the time taken to diagnose a serious medical condition, and is therefore able to provide more timely assistance to a patient with a serious medical condition. In one implementation, machine learning system 110 provides a diagnosis from a 3D radiological volume. For example, that intracranial hemorrhaging is present. In one implementation, machine learning system 110 provides indicators from the 3D radiological volume, rather than an actual diagnosis. For example, the 3D radiological volume can identify fluid in the sinuses and/or extracranial blood, both of which are indicators of a skull fracture. In one implementation, machine learning system 110 does not draw the conclusion whether or not there is a skull fracture but rather identifies the indicators based on the image data. In another implementation, machine learning system 110 does draw the conclusion, whether or not there is a skull fracture based on the indicators. In one implementation, machine learning system 110 provides confidence intervals for the conclusion as well as the indicators.

In some implementations, machine learning system 110 provides alerts based on the results of its analysis of the 3D radiological volume. In some implementations, machine learning system 110 provides risk factors associated with medical conditions. For example, in one implementation, machine learning system 110 can attach a confidence rating to conditions found in a 3D medical image as an indicator for future abnormalities.

Figure 10:
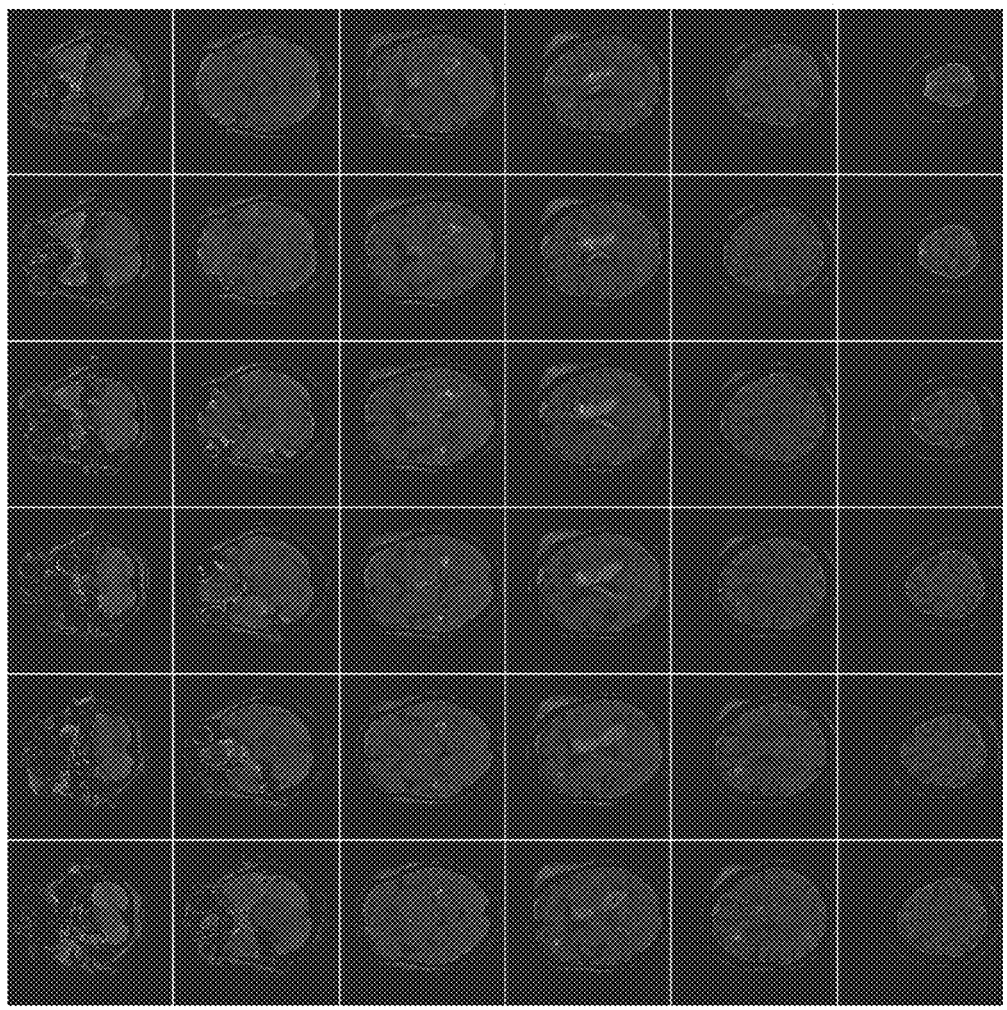
FIG. 10 depicts one implementation of backtracking the 3D input data shown in FIG. 7 to determine, based on the output of the 3D DCNNA, features of the 3D input data that most contributed to the computation of the output.

FIG. 10 depicts one implementation of backtracking 1000 the 3D input data/radiological volume shown in FIG. 7 to determine, based on the output of the 3D DCNNA, features of the 3D input data/radiological volume that most contributed to the computation of the output. Through backtracking 1000, features of the 3D input data that most contributed to the computation of the output are highlighted as white structures within individual blue brain images in FIG. 10.

Figure 11:
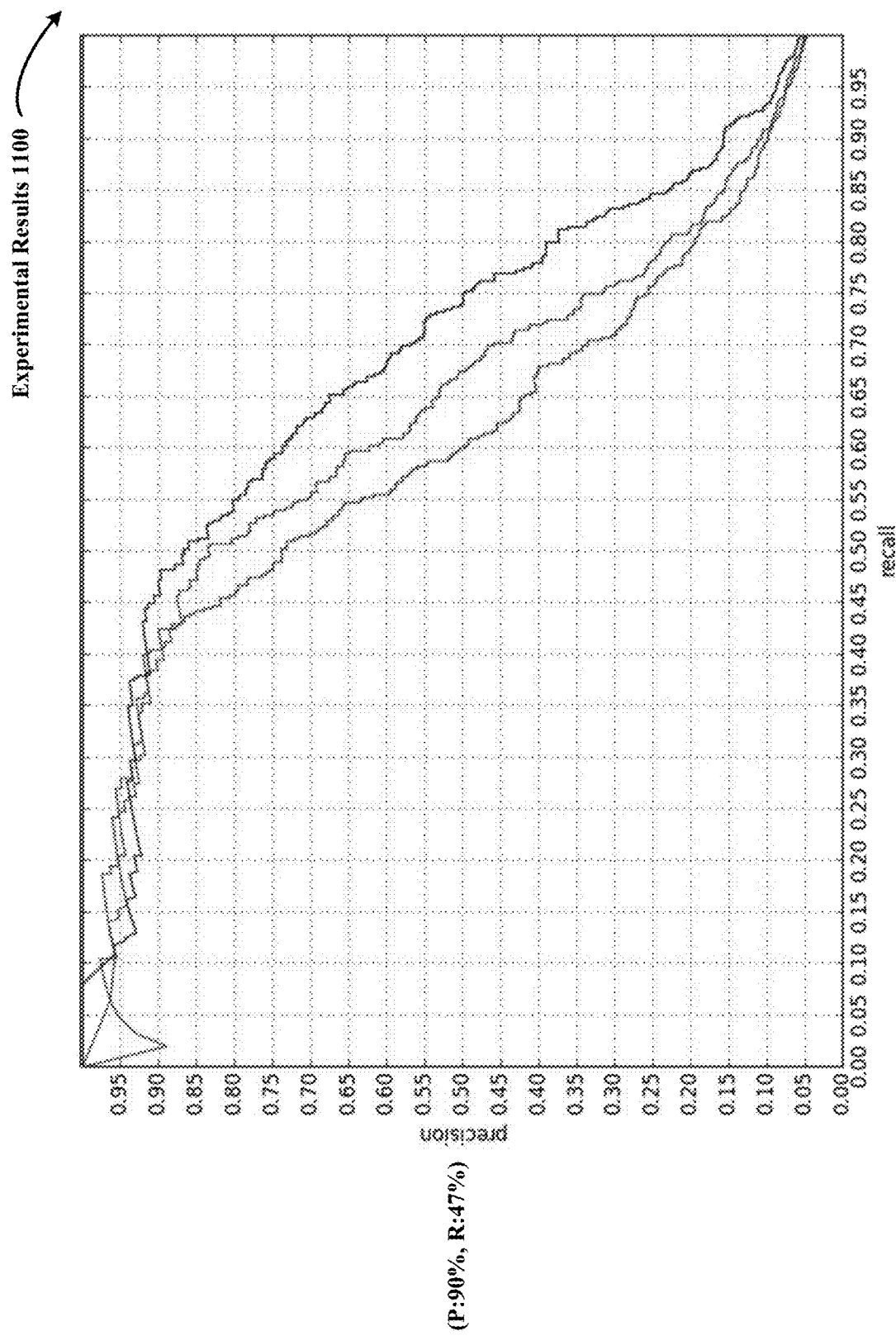
FIG. 11 shows a precision-recall curve to demonstrate one implementation of experimental results of a 3D CNN that did not use the disclosed DCNNA.
Figure 12:
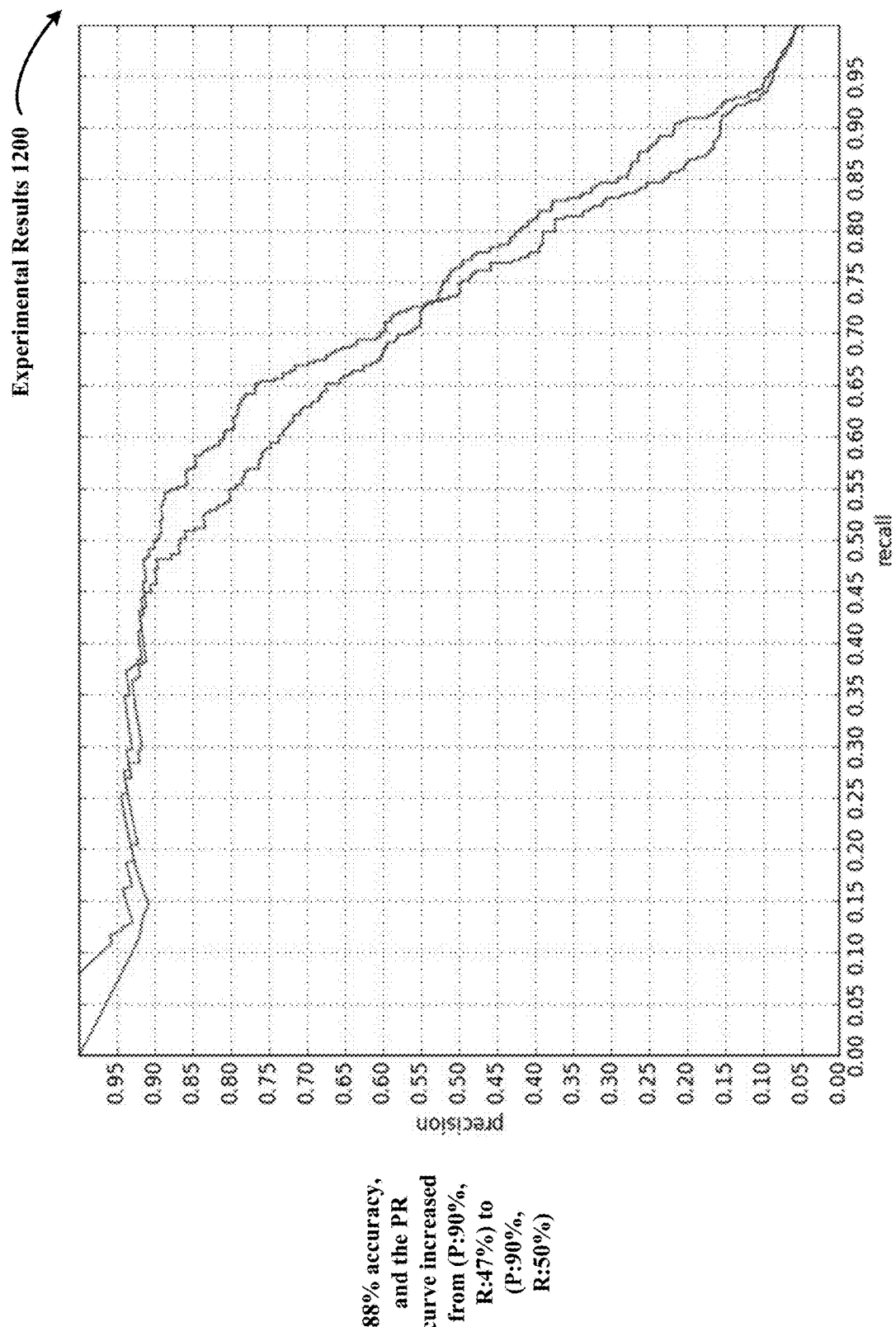
FIG. 12 depicts a precision-recall curve to demonstrate one implementation of experimental results of a 3D CNN that used the disclosed DCNNA.

FIG. 11 shows a precision-recall curve 1100 to demonstrate one implementation of experimental results of a 3D CNN that did not use the disclosed DCNNA. In precision-recall curve 1100, the precision rate is 90% and the recall rate is 47%. FIG. 12 depicts a precision-recall curve 1200 to demonstrate one implementation of experimental results of a 3D CNN that used the disclosed DCNNA. In precision-recall curve 1200, the precision rate is 90% and the recall rate has increased from 47% to 50%.

Processes

Figure 13:
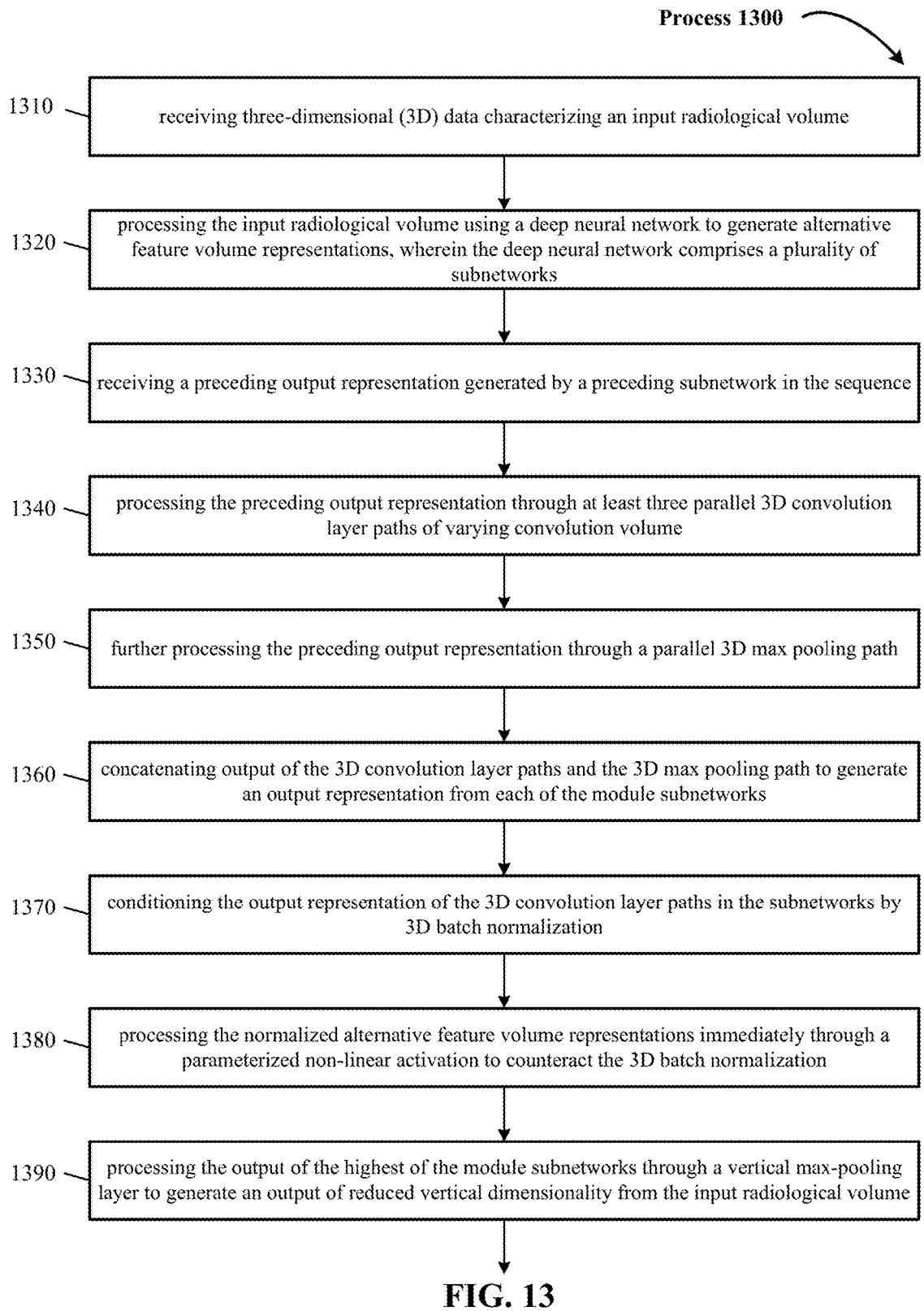
FIG. 13 is a representative method of convoluting 3D data in a deep neural network.

FIG. 13 is a representative method 1300 of convoluting 3D data in a deep neural network. Flowchart 1300 can be implemented at least partially with a computer or other data processing system, e.g., by one or more processors configured to receive or retrieve information, process the information, store results, and transmit the results. Other implementations may perform the actions in different orders and/or with different, fewer or additional actions than those illustrated in FIG. 13. Multiple actions can be combined in some implementations. For convenience, this flowchart is described with reference to the system that carries out a method. The system is not necessarily part of the method.

The method described in this section and other sections of the technology disclosed can include one or more of the following features and/or features described in connection with additional methods disclosed. In the interest of conciseness, the combinations of features disclosed in this application are not individually enumerated and are not repeated with each base set of features. The reader will understand how features identified in this method can readily be combined with sets of base features identified as implementations such as system overview, 3D CNN, 3D data/3D radiology volume, subnetwork modules, batch normalization, exemplary DCNNA, IH use case, etc.

FIG. 13 includes process 1300 that begins at action 1310, where three-dimensional (3D) data characterizing an input radiological volume is received. In some implementations, input radiological volume are volumetric representations with each point (x, y, z) mapped to discrete voxel coordinates (i, j, k). In one implementation, the 3D input data has a volume of D×D×D voxels set to a fixed occupancy or surface curvature grid (e.g., 24×24×24, 32×32×32, 256×256×256, 200×150×150, 317×215×254, 36×224×224). The number of features extracted from the 3D data is prepended, to form F×D×D×D. The number of vertical slices traditionally is less than the number of 2D pixels in each slice, to make manageable the number of images that a radiologist views. In one implementation in the medical vision context, the 3D training and testing data is 3D radiological volume representing 3D anatomical shape variations of a human organ structure generated from medical scans. In one implementation, input radiological volume represent 3D model of a human brain. In yet other implementations, input radiological volume represent 3D point clouds. In other implementations, other examples of input radiological volume include CAD (computer-aided drafting) models.

Process 1300 continues at action 1320 where the 3D data characterizing the input radiological volume is processed using a deep neural network to generate alternative feature volume representations of the input radiological volume. In one implementation, the deep neural network comprises of a plurality of subnetworks. In one implementation, the subnetworks are arranged in a sequence from lowest to highest and processing the data characterizing the input radiological volume using the deep neural network comprises processing the data through each of the subnetworks in the sequence. In one implementation, a first 3D convolution layer path is a 3×3×3 convolution that extracts semi-global features from the input radiological volume. In one implementation, a second 3D convolution layer path is a 5×5×5 convolution that extracts global features from the input radiological volume. In one implementation, a third 3D convolution layer path is a 1×1×1 convolution that extracts local features from the input radiological volume.

At action 1330, three or more of the subnetworks are module subnetworks and each of the module subnetworks is configured to receive a preceding output representation generated by a preceding subnetwork in the sequence, as discussed supra.

At action 1340, three or more of the subnetworks are module subnetworks and each of the module subnetworks is configured to process the preceding output representation through at least three parallel 3D convolution layer paths of varying convolution volume, as discussed supra.

At action 1350, three or more of the subnetworks are module subnetworks and each of the module subnetworks is configured to further process the preceding output representation through a parallel 3D max pooling path, as discussed supra.

At action 1360, three or more of the subnetworks are module subnetworks and each of the module subnetworks is configured to concatenate output of the 3D convolution layer paths and the 3D max pooling path to generate an output representation from each of the module subnetworks, as discussed supra.

At action 1370, the output representation of the 3D convolution layer paths in the subnetworks is conditioned by 3D batch normalization, as discussed supra. In one implementation, the 3D batch normalization is applied independently to respective features in the alternative feature volume representations and is applied on a batch basis. In one implementation, for the alternative feature value representations in a batch, the 3D batch normalization scales and shifts image data values such that normalized alternative feature volume representations have a zero mean and a unit variance of the image data values.

At action 1380, the process includes processing the normalized alternative feature volume representations immediately through a parameterized non-linear activation with learnable scaling and shifting parameters by which training of the deep neural network can counteract the 3D batch normalization, as discussed supra.

At action 1390, the process includes following processing the data through the three or more module subnetworks, processing the output of the highest of the module subnetworks through a vertical max-pooling layer to generate an output of reduced vertical dimensionality from the input radiological volume, as discussed supra.

Other implementations of the method described in this section can include a non-transitory computer readable storage medium storing instructions executable by a processor to perform any of the methods described above. Yet another implementation of the method described in this section can include a system including memory and one or more processors operable to execute instructions, stored in the memory, to perform any of the methods described above.

Figure 14:
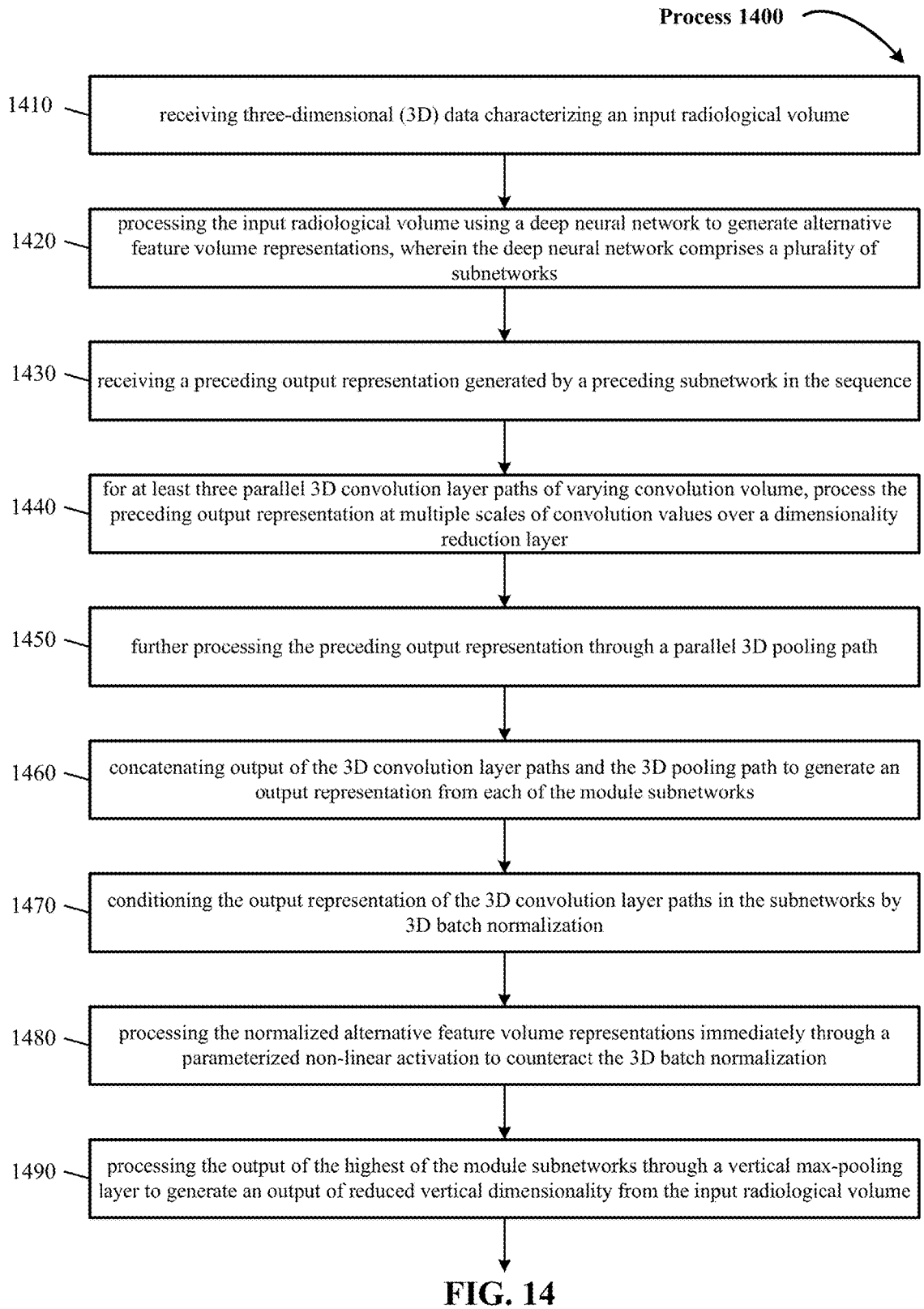
FIG. 14 illustrates another process of convoluting 3D data in a deep neural network.

FIG. 14 is a representative method 1400 of convoluting 3D data in a deep neural network. Flowchart 1400 can be implemented at least partially with a computer or other data processing system, e.g., by one or more processors configured to receive or retrieve information, process the information, store results, and transmit the results. Other implementations may perform the actions in different orders and/or with different, fewer or additional actions than those illustrated in FIG. 14. Multiple actions can be combined in some implementations. For convenience, this flowchart is described with reference to the system that carries out a method. The system is not necessarily part of the method.

The method described in this section and other sections of the technology disclosed can include one or more of the following features and/or features described in connection with additional methods disclosed. In the interest of conciseness, the combinations of features disclosed in this application are not individually enumerated and are not repeated with each base set of features. The reader will understand how features identified in this method can readily be combined with sets of base features identified as implementations such as system overview, 3D CNN, 3D data/3D radiology volume, subnetwork modules, batch normalization, exemplary DCNNA, IH use case, etc.

FIG. 14 includes process 1400 that begins at action 1410, where three-dimensional (3D) data characterizing an input radiological volume is received. In some implementations, input radiological volume are volumetric representations with each point (x, y, z) mapped to discrete voxel coordinates (i, j, k). In one implementation, the 3D input data has a volume of D×D×D voxels set to a fixed occupancy or surface curvature grid (e.g., 24×24×24, 32×32×32, 256×256×256, 200×150×150, 317×215×254, 36×224×224). In one implementation in the medical vision context, the 3D training and testing data is 3D radiological volume representing 3D anatomical shape variations of a human organ structure generated from medical scans. In one implementation, input radiological volume represent 3D model of a human brain. In yet other implementations, input radiological volume represent 3D point clouds. In other implementations, other examples of input radiological volume include CAD (computer-aided drafting) models.

Process 1400 continues at action 1420 where the 3D data characterizing the input radiological volume is processed using a deep neural network to generate alternative feature volume representations of the input radiological volume. In one implementation, the deep neural network comprises of a plurality of subnetworks. In one implementation, the subnetworks are arranged in a sequence from lowest to highest and processing the data characterizing the input radiological volume using the deep neural network comprises processing the data through each of the subnetworks in the sequence. In one implementation, a first 3D convolution layer path is a 3×3×3 convolution that extracts semi-global features from the input radiological volume. In one implementation, a second 3D convolution layer path is a 5×5×5 convolution that extracts global features from the input radiological volume. In one implementation, a third 3D convolution layer path is a 1×1×1 convolution that extracts local features from the input radiological volume.

At action 1430, for at least three parallel 3D convolution layer paths of varying convolution volume, process the preceding output representation at multiple scales of convolution values over a dimensionality reduction layer, as discussed supra.

At action 1440, three or more of the subnetworks are module subnetworks and each of the module subnetworks is configured to process the preceding output representation through at least three parallel 3D convolution layer paths of varying convolution volume, as discussed supra.

At action 1450, three or more of the subnetworks are module subnetworks and each of the module subnetworks is configured to further process the preceding output representation through a parallel 3D max pooling path, as discussed supra.

At action 1460, three or more of the subnetworks are module subnetworks and each of the module subnetworks is configured to concatenate output of the 3D convolution layer paths and the 3D pooling path to generate an output representation from each of the module subnetworks, as discussed supra. The 3D pooling path includes max, min or average pooling operations.

At action 1470, the output representation of the 3D convolution layer paths in the subnetworks is conditioned by 3D batch normalization, as discussed supra. In one implementation, the 3D batch normalization is applied independently to respective features in the alternative feature volume representations and is applied on a batch basis. In one implementation, for the alternative feature value representations in a batch, the 3D batch normalization scales and shifts image data values such that normalized alternative feature volume representations have a zero mean and a unit variance of the image data values.

At action 1480, the process includes processing the normalized alternative feature volume representations immediately through a parameterized non-linear activation with learnable scaling and shifting parameters by which training of the deep neural network can counteract the 3D batch normalization, as discussed supra.

At action 1490, the process includes following processing the data through the three or more module subnetworks, processing the output of the highest of the module subnetworks through a vertical max-pooling layer to generate an output of reduced vertical dimensionality from the input radiological volume, as discussed supra.

Other implementations of the method described in this section can include a non-transitory computer readable storage medium storing instructions executable by a processor to perform any of the methods described above. Yet another implementation of the method described in this section can include a system including memory and one or more processors operable to execute instructions, stored in the memory, to perform any of the methods described above.

Multi-Tenant Integration

Figure 15:
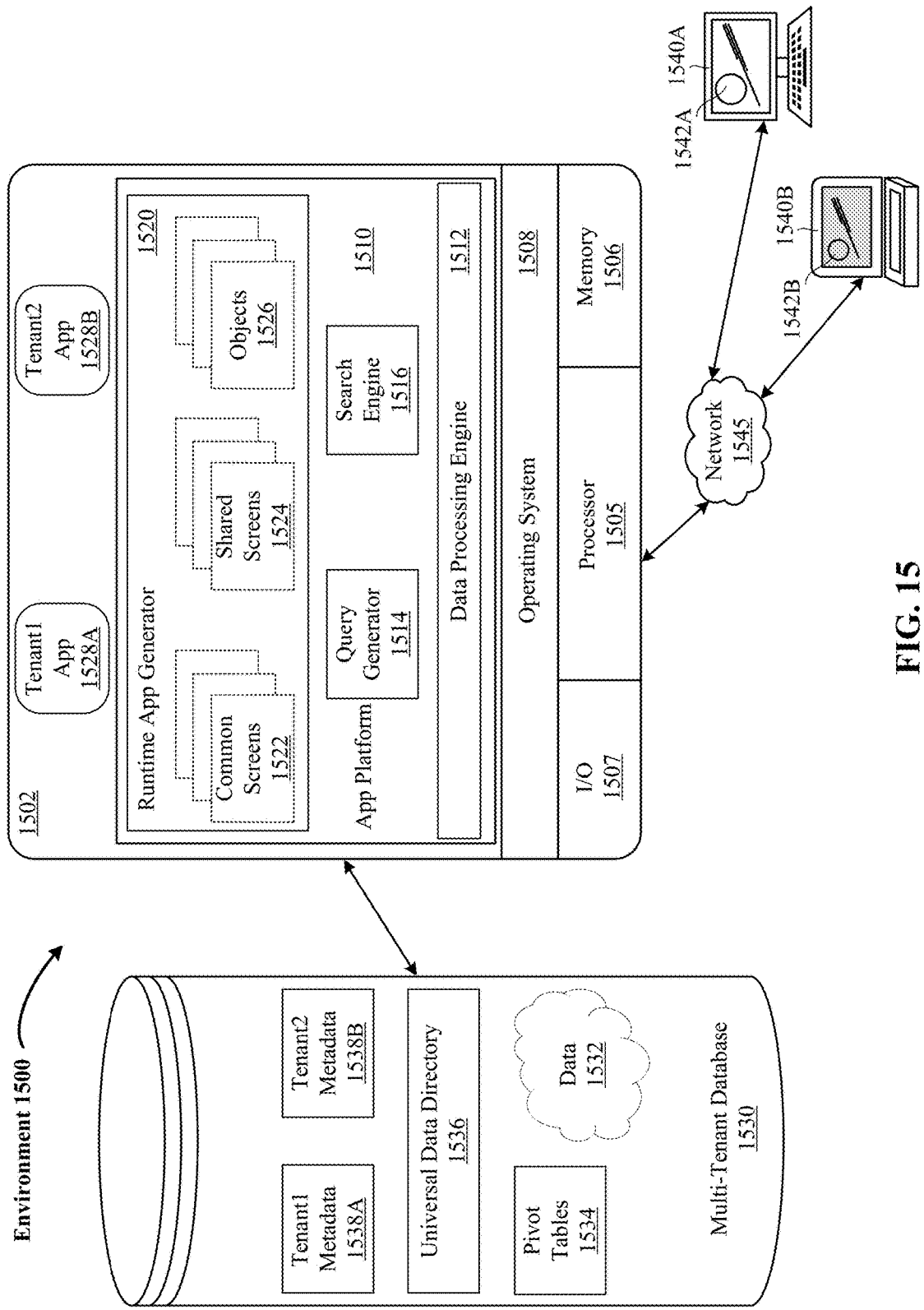
FIG. 15 is a block diagram of an exemplary multi-tenant system suitable for integration with the system of FIG. 1 in accordance with one or more implementations of the technology disclosed.

FIG. 15 is a block diagram of an exemplary multi-tenant system suitable for integration with the system of FIG. 1 in accordance with one or more implementations of the technology disclosed. System 100 of FIG. 1 can be implemented using a multi-tenant system. In that regard, FIG. 15 presents a conceptual block diagram of an exemplary multi-tenant system suitable for integration with the system 100 of FIG. 1 in accordance with one or more implementations.

In general, the illustrated multi-tenant system 1500 of FIG. 15 includes a server 1502 that dynamically creates and supports virtual applications 1528A and 1528B based upon data 1532 from a common database 1530 that is shared between multiple tenants, alternatively referred to herein as a "multi-tenant database". Data and services generated by the virtual applications 1528A and 1528B are provided via a network 1545 to any number of client devices 1540A and 1540B, as desired. Virtual applications 1528A and 1528B are suitably generated at run-time (or on-demand) using a common application platform 1510 that securely provides access to the data 1532 in the database 1530 for each of the various tenants subscribing to the multi-tenant system 1500. In accordance with one non-limiting example, the multi-tenant system 1500 is implemented in the form of an on-demand multi-tenant customer relationship management (CRM) system that can support any number of authenticated users of multiple tenants.

As used herein, a "tenant" or an "organization" refers to a group of one or more users that shares access to common subset of the data within the multi-tenant database 1530. In this regard, each tenant includes one or more users associated with, assigned to, or otherwise belonging to that respective tenant. Stated another way, each respective user within the multi-tenant system 1500 is associated with, assigned to, or otherwise belongs to a particular tenant of the plurality of tenants supported by the multi-tenant system 1500. Tenants may represent users, user departments, work or legal organizations, and/or any other entities that maintain data for particular sets of users within the multi-tenant system 1500. Although multiple tenants may share access to the server 1502 and the database 1530, the particular data and services provided from the server 1502 to each tenant can be securely isolated from those provided to other tenants. The multi-tenant architecture therefore allows different sets of users to share functionality and hardware resources without necessarily sharing any of the data 1532 belonging to or otherwise associated with other tenants.

The multi-tenant database 1530 is any sort of repository or other data storage system capable of storing and managing the data 1532 associated with any number of tenants. The database 1530 may be implemented using any type of conventional database server hardware. In various implementations, the database 1530 shares processing hardware with the server 1502. In other implementations, the database 1530 is implemented using separate physical and/or virtual database server hardware that communicates with the server 1502 to perform the various functions described herein. In an exemplary implementation, the database 1530 includes a database management system or other equivalent software capable of determining an optimal query plan for retrieving and providing a particular subset of the data 1532 to an instance of virtual application 1528A or 1528B in response to a query initiated or otherwise provided by a virtual application 1528A or 1528B. The multi-tenant database 1530 may alternatively be referred to herein as an on-demand database, in that the multi-tenant database 1530 provides (or is available to provide) data at run-time to on-demand virtual applications 1528A and 1528B generated by the application platform 1510.

In practice, the data 1532 may be organized and formatted in any manner to support the application platform 1510. In various implementations, the data 1532 is suitably organized into a relatively small number of large data tables to maintain a semi-amorphous "heap"-type format. The data 1532 can then be organized as needed for a particular virtual application 1528A or 1528B. In various implementations, conventional data relationships are established using any number of pivot tables 1534 that establish indexing, uniqueness, relationships between entities, and/or other aspects of conventional database organization as desired. Further data manipulation and report formatting is generally performed at run-time using a variety of metadata constructs. Metadata within a universal data directory (UDD) 1536, for example, can be used to describe any number of forms, reports, workflows, user access privileges, work logic and other constructs that are common to multiple tenants. Tenant-specific formatting, functions and other constructs may be maintained as tenant-specific metadata 1538A- and 1538B for each tenant, as desired. Rather than forcing the data 1532 into an inflexible global structure that is common to the tenants and applications, the database 1530 is organized to be relatively amorphous, with the pivot tables 1534 and the metadata 1538A and 1538B providing additional structure on an as-needed basis. To that end, the application platform 1510 suitably uses the pivot tables 1534 and/or the metadata 1538A and 1538B to generate "virtual" components of the virtual applications 1528A and 1528B to logically obtain, process, and present the relatively amorphous data 1532 from the database 1530.

The server 1502 is implemented using one or more actual and/or virtual computing systems that collectively provide the dynamic application platform 1510 for generating the virtual applications 1528A and 1528B. For example, the server 1502 may be implemented using a cluster of actual and/or virtual servers operating in conjunction with each other, typically in association with conventional network communications, cluster management, load balancing and other features as appropriate. The server 1502 operates with any sort of conventional processing hardware, such as a processor 1505, memory 1506, input/output features 1507 and the like. The input/output features 1507 generally represent the interface(s) to networks (e.g., to the network 1545, or any other local area, wide area or other network), mass storage, display devices, data entry devices and/or the like. The processor 1505 may be implemented using any suitable processing system, such as one or more processors, controllers, microprocessors, microcontrollers, processing cores and/or other computing resources spread across any number of distributed or integrated systems, including any number of "cloud-based" or other virtual systems. The memory 1506 represents any non-transitory short or long term storage or other computer-readable media capable of storing programming instructions for execution on the processor 1505, including any sort of random access memory (RAM), read only memory (ROM), flash memory, magnetic or optical mass storage, and/or the like. The computer-executable programming instructions, when read and executed by the server 1502 and/or processor 1505, cause the server 1502 and/or processor 1505 to create, generate, or otherwise facilitate the application platform 1510 and/or virtual applications 1528A and 1528B and perform one or more additional tasks, operations, functions, and/or processes described herein. It should be noted that the memory 1506 represents one suitable implementation of such computer-readable media, and alternatively or additionally, the server 1502 could receive and cooperate with external computer-readable media that is realized as a portable or mobile component or application platform, e.g., a portable hard drive, a USB flash drive, an optical disc, or the like.

The application platform 1510 is any sort of software application or other data processing engine that generates the virtual applications 1528A and 1528B that provide data and/or services to the client devices 1540A and 1540B. In a typical implementation, the application platform 1510 gains access to processing resources, communications interfaces and other features of the processing hardware 1502 using any sort of conventional or proprietary operating system 1508. The virtual applications 1528A and 1528B are typically generated at run-time in response to input received from the client devices 1540A and 1540B. For the illustrated implementation, the application platform 1510 includes a bulk data processing engine 1512, a query generator 1514, a search engine 1516 that provides text indexing and other search functionality, and a runtime application generator 1520. Each of these features may be implemented as a separate process or other module, and many equivalent implementations could include different and/or additional features, components or other modules as desired.

The runtime application generator 1520 dynamically builds and executes the virtual applications 1528A and 1528B in response to specific requests received from the client devices 1540A and 1540B. The virtual applications 1528A and 1528B are typically constructed in accordance with the tenant-specific metadata 1538, which describes the particular tables, reports, interfaces and/or other features of the particular application 1528A and 1528B. In various implementations, each virtual application 1528A and 1528B generates dynamic web content that can be served to a browser or other client programs 1542A and 1542B associated with its client device 1540A and 1540B, as appropriate.

The runtime application generator 1520 suitably interacts with the query generator 1514 to efficiently obtain multi-tenant data 1532 from the database 1530 as needed in response to input queries initiated or otherwise provided by users of the client devices 1540A and 1540B. In a typical implementation, the query generator 1514 considers the identity of the user requesting a particular function (along with the user's associated tenant), and then builds and executes queries to the database 1530 using system-wide metadata within a universal data directory (UDD) 1536, tenant specific metadata 1538, pivot tables 1534, and/or any other available resources. The query generator 1514 in this example therefore maintains security of the common database 1530 by ensuring that queries are consistent with access privileges granted to the user and/or tenant that initiated the request. In this manner, the query generator 1514 suitably obtains requested subsets of data 1532 accessible to a user and/or tenant from the database 1530 as needed to populate the tables, reports or other features of the particular virtual application 1528A or 1528B for that user and/or tenant.

Still referring to FIG. 15, the data processing engine 1512 performs bulk processing operations on the data 1532 such as uploads or downloads, updates, online transaction processing, and/or the like. In many implementations, less urgent bulk processing of the data 1532 can be scheduled to occur as processing resources become available, thereby giving priority to more urgent data processing by the query generator 1514, the search engine 1516, the virtual applications 1528A and 1528B, etc.

In exemplary implementations, the application platform 1510 is utilized to create and/or generate data-driven virtual applications 1528A and 1528B for the tenants that they support. Such virtual applications 1528A and 1528B may make use of interface features such as custom (or tenant-specific) screens 1524, standard (or universal) screens 1522 or the like. Any number of custom and/or standard objects 1526 may also be available for integration into tenant-developed virtual applications 1528A and 1528B. As used herein, "custom" should be understood as meaning that a respective object or application is tenant-specific (e.g., only available to users associated with a particular tenant in the multi-tenant system) or user-specific (e.g., only available to a particular subset of users within the multi-tenant system), whereas "standard" or "universal" applications or objects are available across multiple tenants in the multi-tenant system. The data 1532 associated with each virtual application 1528A and 1528B is provided to the database 1530, as appropriate, and stored until it is requested or is otherwise needed, along with the metadata 1538 that describes the particular features (e.g., reports, tables, functions, objects, fields, formulas, code, etc.) of that particular virtual application 1528A and 1528B. For example, a virtual application 1528A and 1528B may include a number of objects 1526 accessible to a tenant, wherein for each object 1526 accessible to the tenant, information pertaining to its object type along with values for various fields associated with that respective object type are maintained as metadata 1538 in the database 1530. In this regard, the object type defines the structure (e.g., the formatting, functions and other constructs) of each respective object 1526 and the various fields associated therewith.

With continued reference to FIG. 15, the data and services provided by the server 1502 can be retrieved using any sort of personal computer, mobile telephone, tablet or other network-enabled client device 1540A or 1540B on the network 1545. In an exemplary implementation, the client device 1540A or 1540B includes a display device, such as a monitor, screen, or another conventional electronic display capable of graphically presenting data and/or information retrieved from the multi-tenant database 1530. Typically, the user operates a conventional browser application or other client program 1542 executed by the client devices 1540A and 1540B to contact the server 1502 via the network 1545 using a networking protocol, such as the hypertext transport protocol (HTTP) or the like. The user typically authenticates his or her identity to the server 1502 to obtain a session identifier ("SessionID") that identifies the user in subsequent communications with the server 1502. When the identified user requests access to a virtual application 1528A or 1528B, the runtime application generator 1520 suitably creates the application at run time based upon the metadata 1538, as appropriate. As noted above, the virtual application 1528A or 1528B may contain Java, ActiveX, or other content that can be presented using conventional client software running on the client device 1540A or 1540B; other implementations may simply provide dynamic web or other content that can be presented and viewed by the user, as desired.

The foregoing description is merely illustrative in nature and is not intended to limit the implementations of the subject matter or the application and uses of such implementations. Furthermore, there is no intention to be bound by any expressed or implied theory presented in the technical field, background, or the detailed description. As used herein, the word "exemplary" means "serving as an example, instance, or illustration." Any implementation described herein as exemplary is not necessarily to be construed as preferred or advantageous over other implementations, and the exemplary implementations described herein are not intended to limit the scope or applicability of the subject matter in any way.

For the sake of brevity, conventional techniques related to databases, social networks, user interfaces, and other functional aspects of the systems (and the individual operating components of the systems) may not be described in detail herein. In addition, those skilled in the art will appreciate that implementations may be practiced in conjunction with any number of system and/or network architectures, data transmission protocols, and device configurations, and that the system described herein is merely one suitable example. Furthermore, certain terminology may be used herein for the purpose of reference only, and thus is not intended to be limiting. For example, the terms "first", "second" and other such numerical terms do not imply a sequence or order unless clearly indicated by the context.

Implementations of the subject matter may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processing systems or devices can carry out the described operations, tasks, and functions by manipulating electrical signals representing data bits at accessible memory locations, as well as other processing of signals. The memory locations where data bits are maintained are physical locations that have particular electrical, magnetic, optical, or organic properties corresponding to the data bits. It should be appreciated that the various block components shown in the figures may be realized by any number of hardware, software, and/or firmware components configured to perform the specified functions. For example, an implementation of a system or a component may employ various integrated circuit components, e.g., memory elements, digital signal processing elements, logic elements, look-up tables, or the like, which may carry out a variety of functions under the control of one or more microprocessors or other control devices. When implemented in software or firmware, various elements of the systems described herein are essentially the code segments or instructions that perform the various tasks. The program or code segments can be stored in a processor-readable medium or transmitted by a computer data signal embodied in a carrier wave over a transmission medium or communication path. The "processor-readable medium" or "machine-readable medium" may include any non-transitory medium that can store or transfer information. Examples of the processor-readable medium include an electronic circuit, a semiconductor memory device, a ROM, a flash memory, an erasable ROM (EROM), a floppy diskette, a CD-ROM, an optical disk, a hard disk, a fiber optic medium, a radio frequency (RF) link, or the like. The computer data signal may include any signal that can propagate over a transmission medium such as electronic network channels, optical fibers, air, electromagnetic paths, or RF links. The code segments may be downloaded via computer networks such as the Internet, an intranet, a LAN, or the like. In this regard, the subject matter described herein can be implemented in the context of any computer-implemented system and/or in connection with two or more separate and distinct computer-implemented systems that cooperate and communicate with one another. In one or more exemplary implementations, the subject matter described herein is implemented in conjunction with a virtual user relationship management (CRM) application in a multi-tenant environment.

Any data structures and code described or referenced above are stored according to many implementations on a computer-readable storage medium, which may be any device or medium that can store code and/or data for use by a computer system. This includes, but is not limited to, volatile memory, non-volatile memory, application-specific integrated circuits (ASICs), field-programmable gate arrays (FPGAs), magnetic and optical storage devices such as disk drives, magnetic tape, CDs (compact discs), DVDs (digital versatile discs or digital video discs), or other media capable of storing computer-readable media now known or later developed.

The preceding description is presented to enable the making and use of the technology disclosed. Various modifications to the disclosed implementations will be apparent, and the general principles defined herein may be applied to other implementations and applications without departing from the spirit and scope of the technology disclosed. Thus, the technology disclosed is not intended to be limited to the implementations shown, but is to be accorded the widest scope consistent with the principles and features disclosed herein. The scope of the technology disclosed is defined by the appended claims.

What is claimed is:

1. A computer-implemented method of classifying three-dimensional (3D) data characterizing a radiological volume in a deep neural network, the method including:
   receiving three-dimensional (3D) data characterizing an input radiological volume representing 3D anatomical shape variations of a human organ structure generated from medical scans;

processing the 3D data characterizing the input radiological volume using a deep neural network to generate alternative feature volume representations of the input radiological volume, wherein the deep neural network comprises a plurality of subnetworks, wherein the subnetworks are arranged in a sequence, and wherein processing the data characterizing the input radiological volume using the deep neural network comprises processing the data through each of the subnetworks in the sequence;

wherein three or more of the subnetworks are module subnetworks and each of the module subnetworks is configured to:
  receive a preceding output representation generated by a preceding subnetwork in the sequence;
  process the preceding output representation through at least three parallel 3D convolution layer paths of varying convolution volume;
  further process the preceding output representation through a parallel 3D max pooling path; and
  concatenate output of the 3D convolution layer paths and the 3D max pooling path to generate an output representation from each of the module subnetworks;

following processing the data through the three or more module subnetworks, processing the output of a last one of the module subnetworks in the sequence through a vertical max-pooling layer to generate an output having a dimensionality that is reduced from a dimensionality of the input radiological volume; and classifying the received 3D data based upon the generated output;

wherein classifying the received 3D data based upon the generated output comprises classifying the received 3D data as a class of a set of classes consisting of:
  including an indication of hemorrhage;
  including evidence of possible Alzheimer's;
  including indications of a stroke;
  including an indication of fluid in a sinuses;
  including an indication of extracranial blood;
  including an indication of a skull fracture; and
  normal.

2. The method of claim 1, wherein a first 3D convolution layer path is a 3×3×3 convolution that extracts semi-global features from the input radiological volume.

3. The method of claim 1, wherein a second 3D convolution layer path is a 5×5×5 convolution that extracts global features from the input radiological volume.

4. The method of claim 1, wherein a third 3D convolution layer path is a 1×1×1 convolution that extracts local features from the input radiological volume.

5. The method of claim 1, wherein the input radiological volume represents 3D model data.

6. The method of claim 1, wherein the input radiological volume represents CAD (computer-aided drafting) model data.

7. The method of claim 1, wherein the input radiological volume represents 3D point clouds.

8. The method of claim 1, further including:
  conditioning the output representation of the 3D convolution layer paths in the subnetworks by scaling and shifting image data values so that the alternative feature volume representations have a zero mean and a unit variance;
  wherein the scaling and shifting applies independently to respective features in the alternative feature volume representations and is applied on a batch basis.

9. The method of claim 8, further including processing the alternative feature volume representations through a parameterized non-linear activation with learnable scaling and shifting parameters by which training of the deep neural network can counteract the scaling and shifting.

10. A computer-implemented method of classifying three-dimensional (3D) data in a deep neural network, the method including:
  receiving three-dimensional (3D) data characterizing an input radiological volume representing 3 D anatomical shape variations of a human organ structure generated from medical scans;
  processing the 3D data characterizing the input radiological volume using a deep neural network to generate alternative feature volume representations of the input radiological volume, wherein the deep neural network comprises a plurality of subnetworks, wherein the subnetworks are arranged in a sequence, and wherein processing the data characterizing the input radiological volume using the deep neural network comprises processing the data through each of the subnetworks in the sequence;
  wherein three or more of the subnetworks are module subnetworks and each of the module subnetworks is configured to:
    receive a preceding output representation generated by a preceding subnetwork in the sequence;
    for at least three parallel 3D convolution layer paths of varying convolution volume, process the preceding output representation at multiple scales of convolution values over a dimensionality reduction layer;
    further process the preceding output representation through a parallel 3D pooling path; and
    concatenate output of the 3D convolution layer paths and the 3D pooling path to generate an output representation from each of the module subnetworks;
  following processing the data through the three or more module subnetworks, processing the output of a last one of the module subnetworks in the sequence through a vertical pooling layer to generate an output having a dimensionality that is reduced from a dimensionality of the input radiological volume; and
  classifying the received 3D data based upon the generated output;
  wherein classifying the received 3D data based upon the generated output comprises classifying the received 3D data as a class of a set of classes consisting of: including an indication of hemorrhage; including evidence of possible Alzheimer's; including indications of a stroke; including an indication of fluid in a sinuses; including an indication of extracranial blood; including an indication of a skull fracture; and normal.

11. The method of claim 10, wherein a first 3D convolution layer path is a 3×3×3 convolution that extracts semi-global features from the input radiological volume.

12. The method of claim 10, wherein a second 3D convolution layer path is a 5×5×5 convolution that extracts global features from the input radiological volume.

13. The method of claim 10, wherein the dimensional reduction layer is a 1×1×1 convolution that extracts local features from the input radiological volume.

14. The method of claim 10, further including applying one or more preparatory 3D and/or 2D convolutions on the input radiological volume prior to processing by the subnetworks.

15. The method of claim 10, further including applying one or more preparatory 3D and/or 2D pooling operations on the input radiological volume prior to processing by the subnetworks.

16. The method of claim 10, further including applying one or more post-processing 3D and/or 2D convolutions on the input radiological volume after processing by the subnetworks.

17. The method of claim 10, further including applying one or more post-processing 3D and/or 2D pooling operations on the input radiological volume after processing by the subnetworks.

18. The method of claim 10, further including:
conditioning the output representation of the 3D convolution layer paths in the subnetworks by scaling and shifting image data values so that the alternative feature volume representations have a zero mean and a unit variance,
wherein the scaling and shifting applies independently to respective features in the alternative feature volume representations and is applied on a batch basis.

19. The method of claim 18, further including processing the alternative feature volume representations through a parameterized non-linear activation with learnable scaling and shifting parameters by which training of the deep neural network can counteract the scaling and shifting.

20. A non-transitory computer readable storage medium impressed with computer program instructions, the instructions, when executed on a processor, implement the method of claim 1.

21. A non-transitory computer readable storage medium impressed with computer program instructions, the instructions, when executed on a processor, implement the method of claim 8.

22. A non-transitory computer readable storage medium impressed with computer program instructions, the instructions, when executed on a processor, implement the method of claim 9.

23. A non-transitory computer readable storage medium impressed with computer program instructions, the instructions, when executed on a processor, implement the method of claim 10.

24. A system including one or more processors coupled to memory, the memory loaded with computer instructions, the instructions, when executed on the processors, implement actions of claim 1.

25. A system including one or more processors coupled to memory, the memory loaded with computer instructions, the instructions, when executed on the processors, implement actions of claim 8.

26. A system including one or more processors coupled to memory, the memory loaded with computer instructions, the instructions, when executed on the processors, implement actions of claim 9.

27. A system including one or more processors coupled to memory, the memory loaded with computer instructions, the instructions, when executed on the processors, implement actions of claim 10.

* * * * *